(12) United States Patent
Chen

(10) Patent No.: US 10,593,582 B2
(45) Date of Patent: Mar. 17, 2020

(54) TRANSFER HEAD AND METHOD FOR TRANSFERRING MICRO DEVICES

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 175 days.

(21) Appl. No.: 15/904,442

(22) Filed: Feb. 26, 2018

(65) Prior Publication Data
US 2019/0267272 A1    Aug. 29, 2019

(51) Int. Cl.
*H01L 21/677*    (2006.01)
*B81C 3/00*    (2006.01)
*H01L 21/67*    (2006.01)

(52) U.S. Cl.
CPC ........ *H01L 21/67754* (2013.01); *B81C 3/005* (2013.01); *H01L 21/67144* (2013.01); *H01L 21/67721* (2013.01); *B81C 2203/054* (2013.01)

(58) Field of Classification Search
CPC ......... H01L 21/67754; H01L 21/67757; H01L 21/67781; H01L 21/6831; H01L 21/67742; H01L 21/67748; H01L 21/67751; B81C 2203/05; B81C 2203/052; B81C 2201/0194
See application file for complete search history.

(56) References Cited

U.S. PATENT DOCUMENTS

| | | | | |
|---|---|---|---|---|
| 6,080,650 A | * | 6/2000 | Edwards | H01L 21/6835 257/E21.508 |
| 6,669,801 B2 | * | 12/2003 | Yoshimura | H01L 21/6835 156/230 |
| 8,349,116 B1 | * | 1/2013 | Bibl | H01L 21/67144 156/249 |
| 8,415,771 B1 | * | 4/2013 | Golda | B81C 99/0025 257/621 |
| 8,518,204 B2 | * | 8/2013 | Hu | H01L 24/83 156/249 |
| 9,105,492 B2 | * | 8/2015 | Bibl | B25J 15/0052 |
| 2005/0232728 A1 | * | 10/2005 | Rice | H01L 21/4853 414/217 |
| 2012/0018494 A1 | * | 1/2012 | Jang | H01L 24/16 228/125 |
| 2012/0027557 A1 | * | 2/2012 | Ashdown | H01L 21/6833 414/800 |
| 2012/0273455 A1 | * | 11/2012 | Lackowski | B81C 3/001 216/20 |
| 2013/0130416 A1 | * | 5/2013 | Bibl | H01L 21/67144 438/21 |

* cited by examiner

*Primary Examiner* — Tyrone V Hall, Jr.
(74) *Attorney, Agent, or Firm* — CKC & Partners Co., LLC

(57) ABSTRACT

A method for transferring a plurality of micro devices e is provided. The method includes picking up the micro devices from a carrier substrate by a transfer head, and iteratively performing a placing process. The placing process includes moving the transfer head to a position, at which an array of the micro devices is positioned over an array of receiving locations of a receiving substrate, and placing said array of the micro devices onto the array of the receiving locations of the receiving substrate.

9 Claims, 24 Drawing Sheets

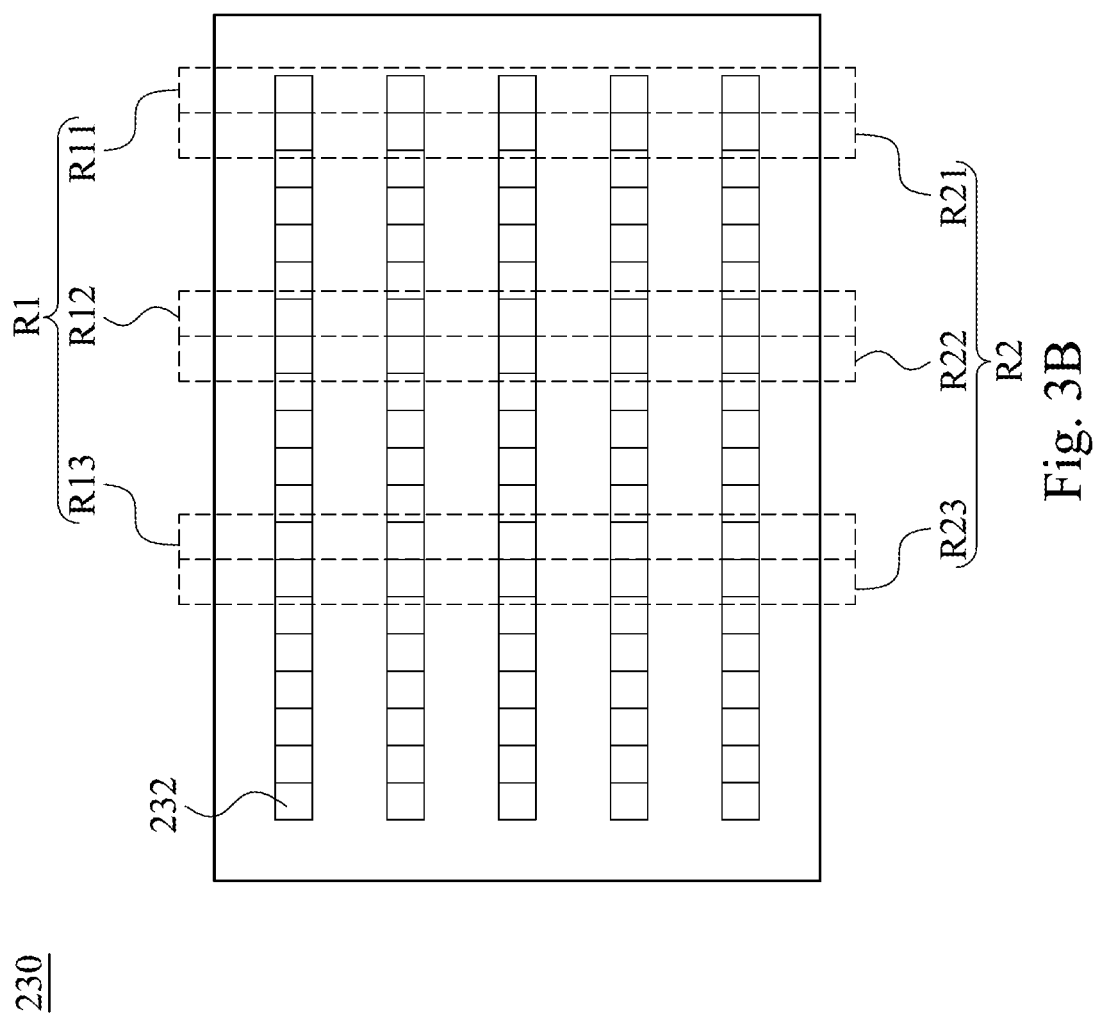

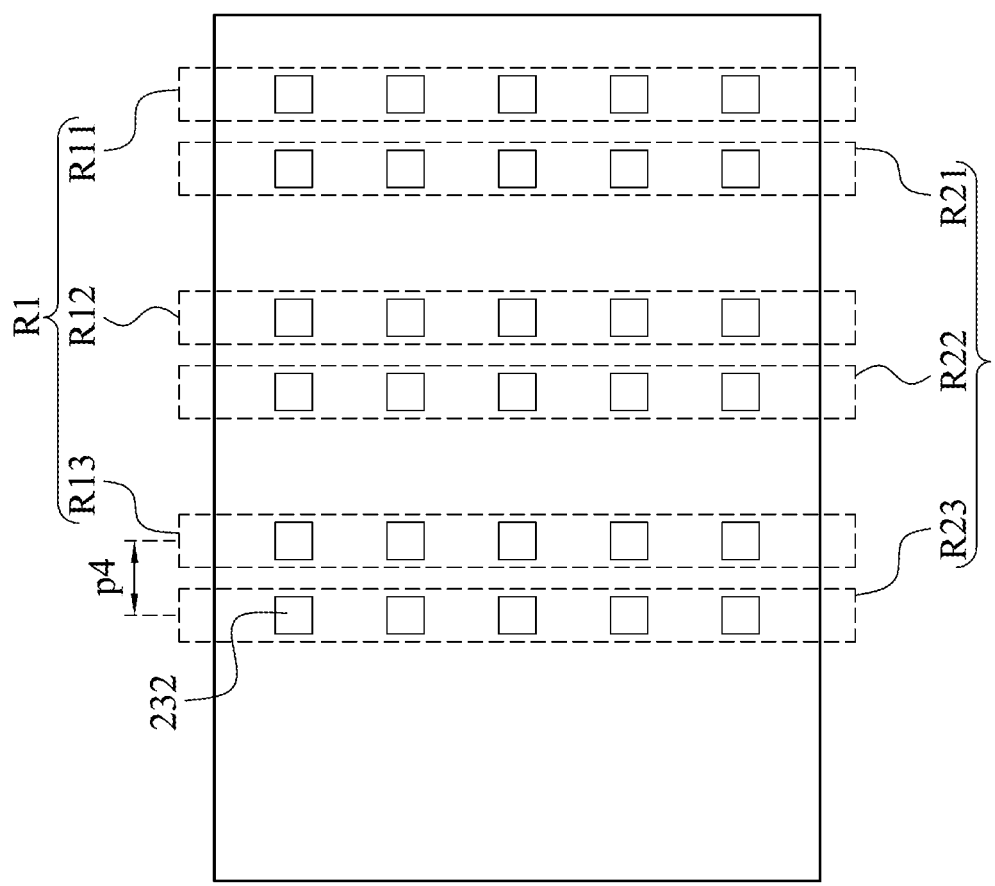

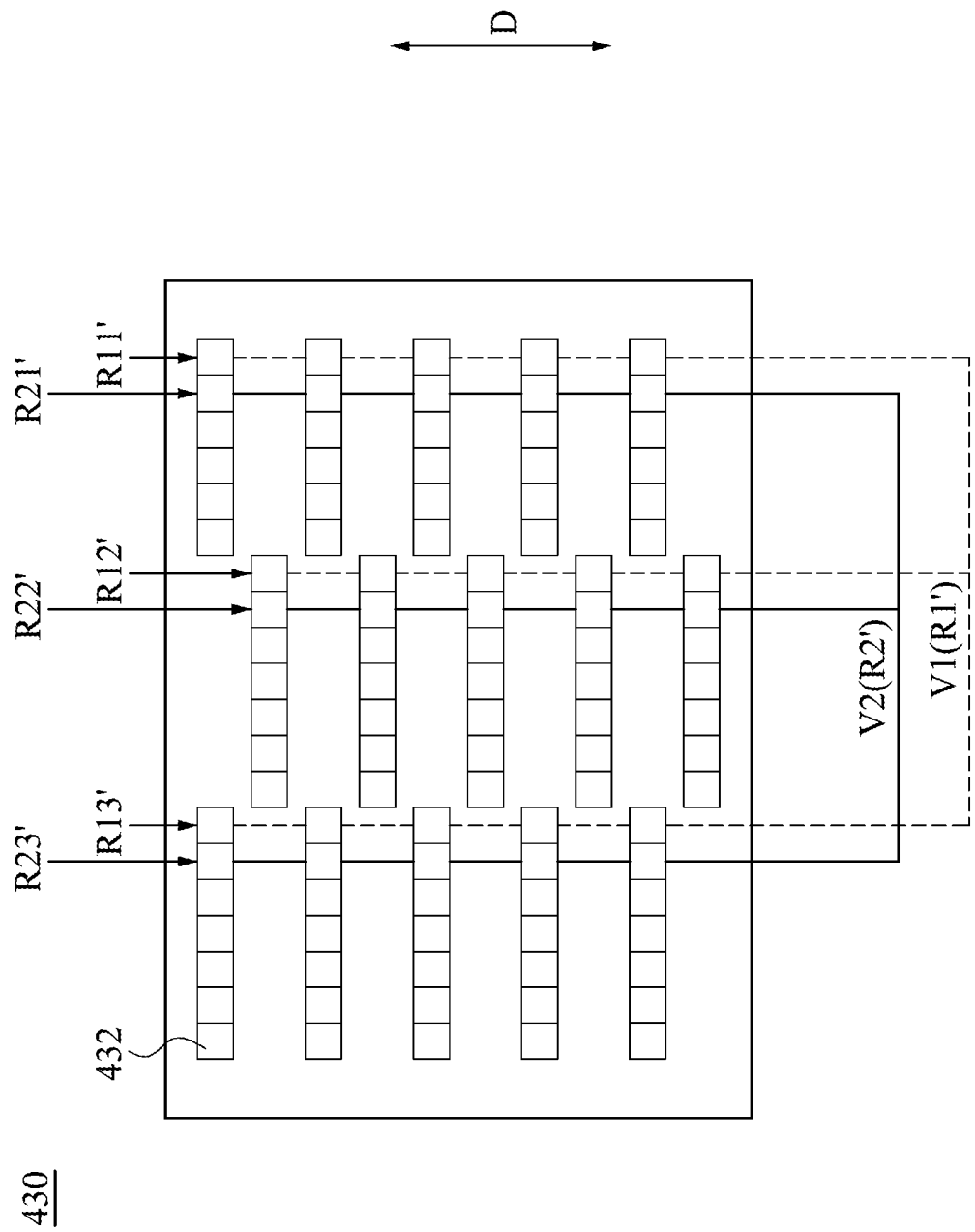

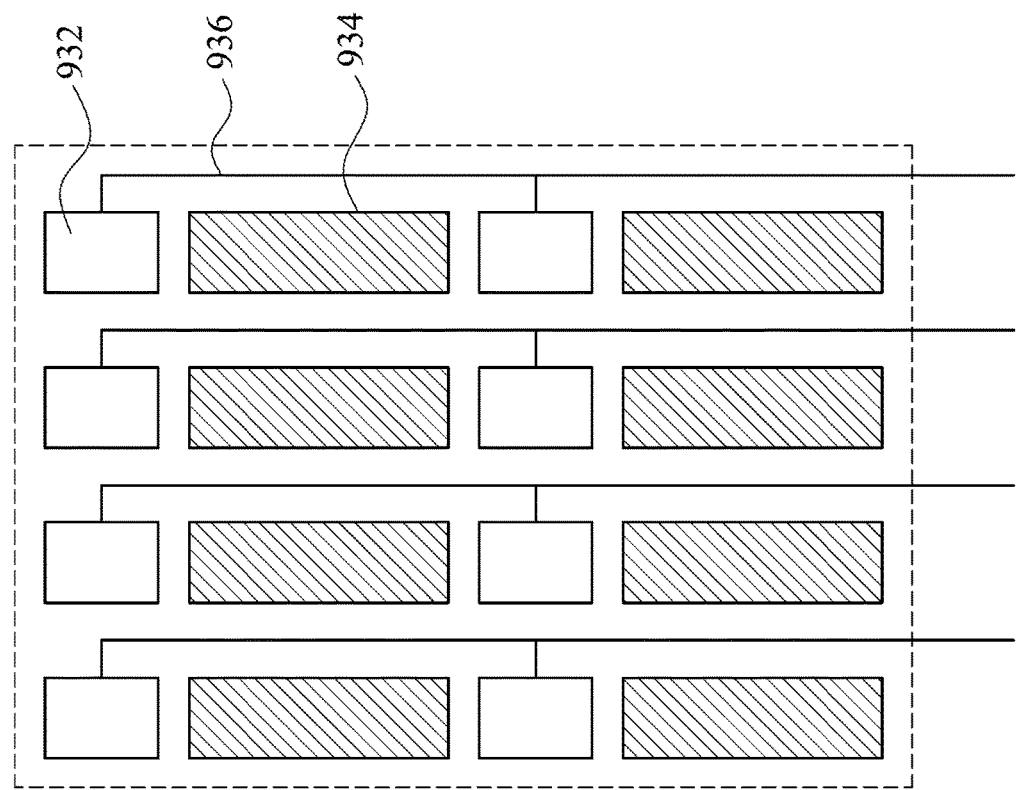

TRANSFER HEAD AND METHOD FOR TRANSFERRING MICRO DEVICES

BACKGROUND

Field of Invention

The present disclosure relates to a transfer head and a method for transferring a plurality of micro devices to a receiving substrate.

Description of Related Art

Manufacturing and packaging of micro devices gradually becomes challenging as the micro devices scale down. Applications of micro devices in various fields such as radio frequency (RF), light emitting diode (LED), microelectromechanical systems (MEMS) are increasing gradually.

One popular technical issue today for micro devices is transferring large number of micro devices, or mass transfer.

SUMMARY

According to some embodiments of the present disclosure, a method for transferring a plurality of micro devices is provided. The method includes picking up the micro devices from a carrier substrate by a transfer head, and iteratively performing a placing process. The placing process includes moving the transfer head to a position, at which an array of the micro devices is positioned over an array of receiving locations of a receiving substrate, and placing said array of the micro devices onto the array of the receiving locations of the receiving substrate.

According to some embodiments of the present disclosure, a transfer head is provided. The transfer head includes a body having a plurality of arrays of grip regions with each of the arrays comprising at least two columns of the grip regions. The grip regions in one of the columns are electrically connected in series. The columns in one of the arrays are controlled by a single voltage source, and the columns in two of the arrays are controlled by two voltage sources respectively.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 3B is a schematic view of a portion of a transfer head with grip regions thereon according to some embodiments of the present disclosure;

FIG. 6C is a schematic view of a portion of a transfer head with grip regions thereon according to some embodiments of the present disclosure;

FIG. 7A is a schematic view of a portion of a transfer head with grip regions thereon according to some embodiments of the present disclosure;

FIG. 9 is a schematic enlarged view of a portion of a transfer head in some embodiments of the present disclosure according to some embodiments of the present disclosure.

DETAILED DESCRIPTION

Figure 1:
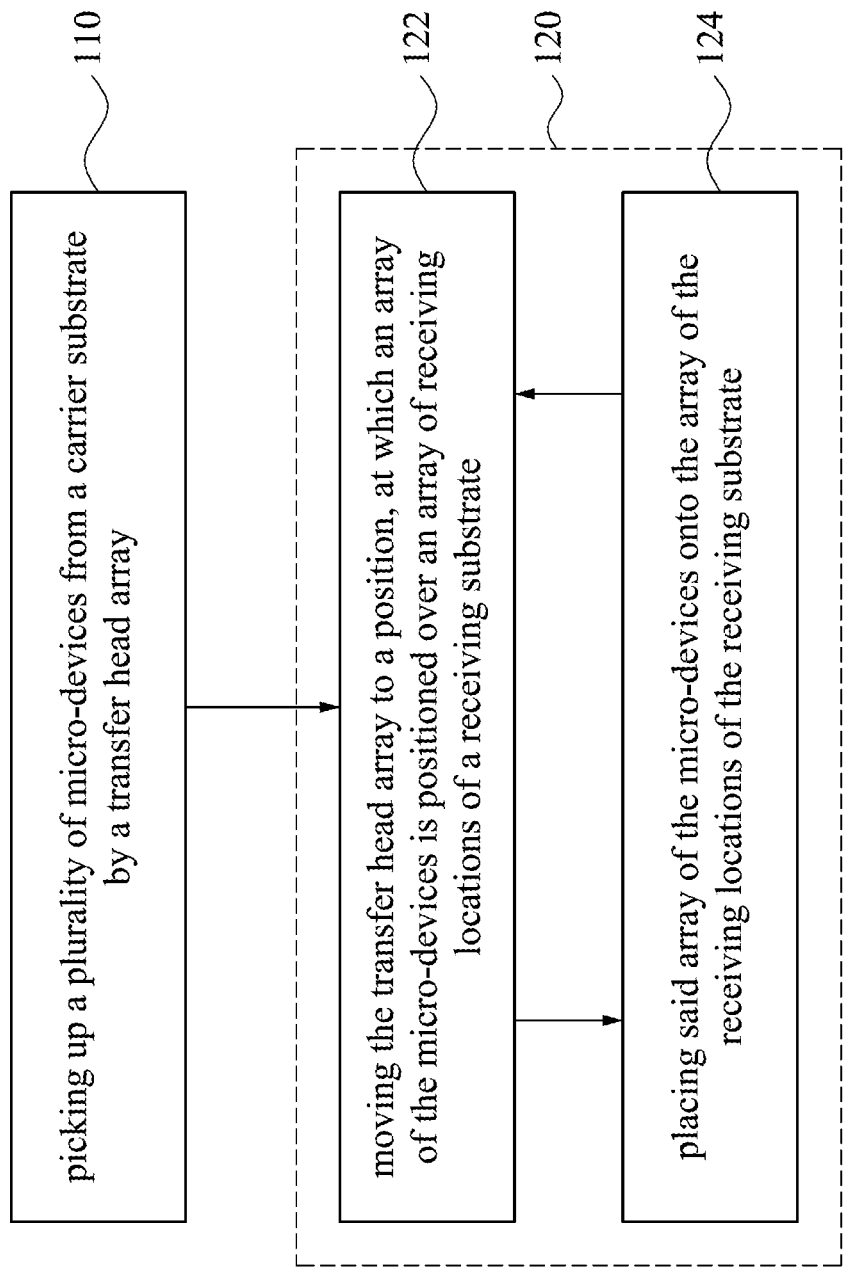
FIG. 1 is a flow chart of a method for transferring a plurality of micro devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

FIG. 1 is a flow chart of a method 100 for transferring a plurality of micro devices according to some embodiments of the present disclosure. FIGS. 2A to 2D are schematic views of first iteration i1 of the method illustrated by FIG. 1. FIGS. 3A to 3C are schematic views of second iteration i2 of the method illustrated by FIG. 1. References are made to FIGS. 1 to 3C. The method 100 begins with operation 110 in which a plurality of micro devices 210 are picked up from a carrier substrate 220 by a transfer head 230 (referring to FIGS. 2A, 2B, 2C, 3A, and 3B). The method 100 continues with operation 120 in which a placing process is iteratively performed. The placing process includes: moving the transfer head 230 to a position at which an array R1 of the micro devices 210 is positioned over an array R1 of receiving locations 244 of a receiving substrate 240 (operation 122); and placing said array R1 of the micro devices 210 onto the array R1 of the receiving locations 244 of the receiving substrate 240 (operation 124)(referring to FIGS. 2D and 3C).

Figure 2B:
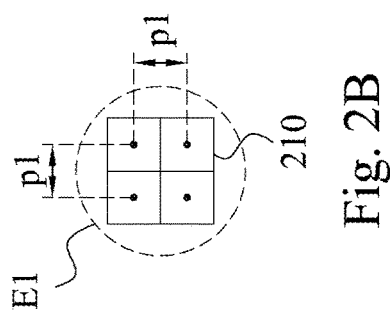
FIG. 2B is an enlarged top view of a carrier substrate with micro devices thereon according to some embodiments of the present disclosure.
Figure 2A:
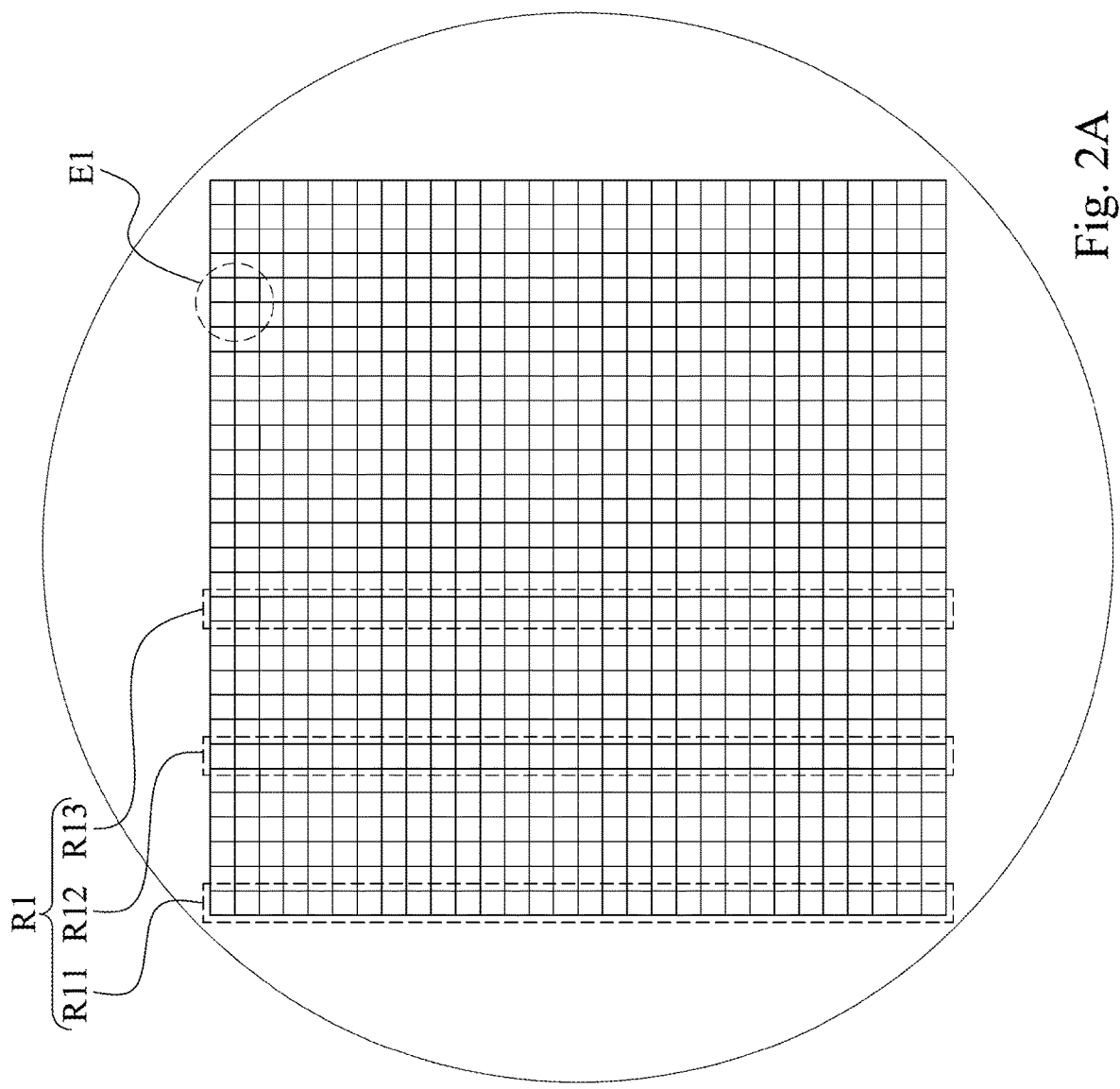
FIG. 2A is a schematic top view of a carrier substrate with micro devices thereon according to some embodiments of the present disclosure.
Figure 3A:
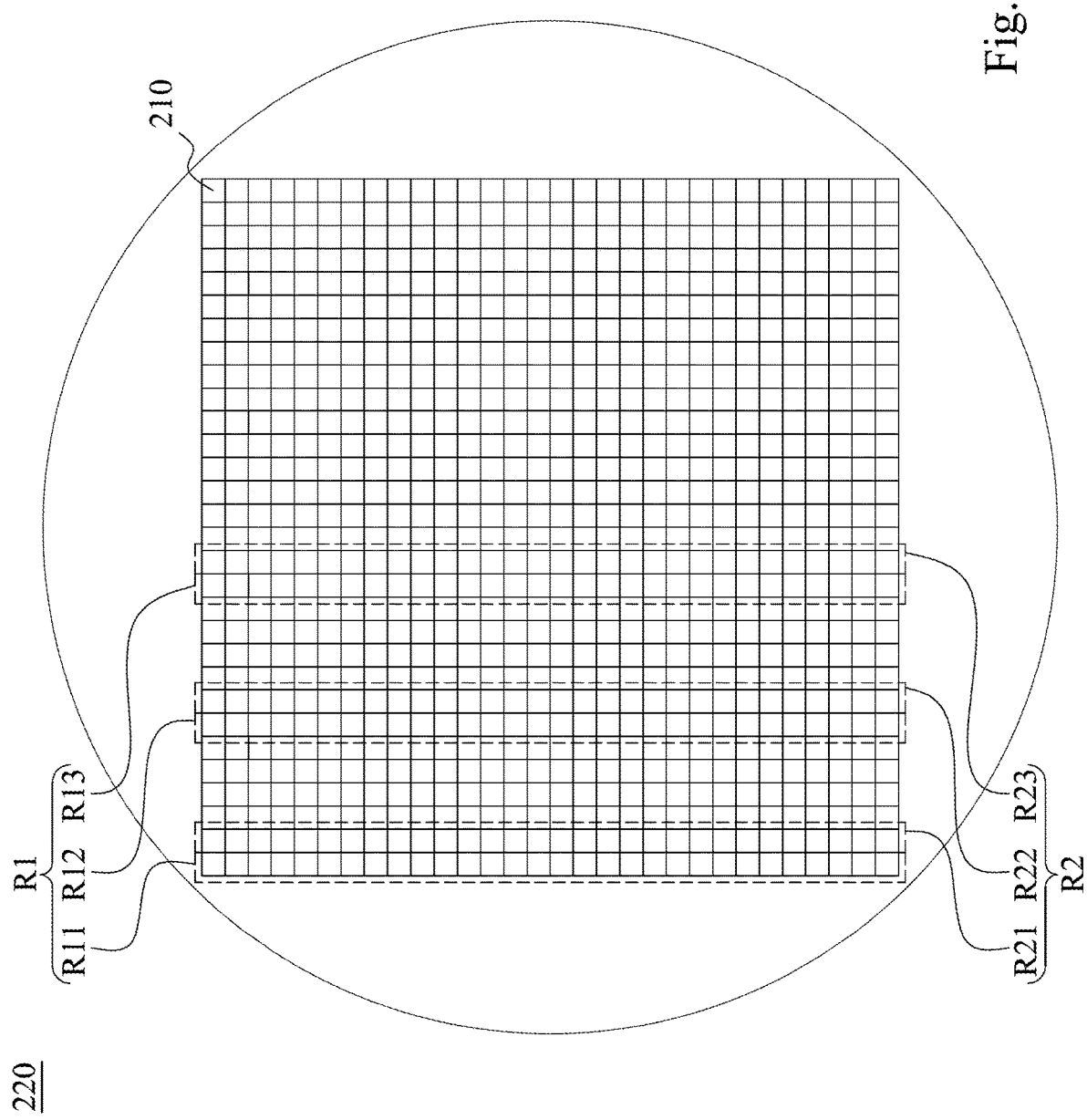
FIG. 3A is a schematic top view of a carrier substrate with micro devices thereon according to some embodiments of the present disclosure.
Figure 3C:
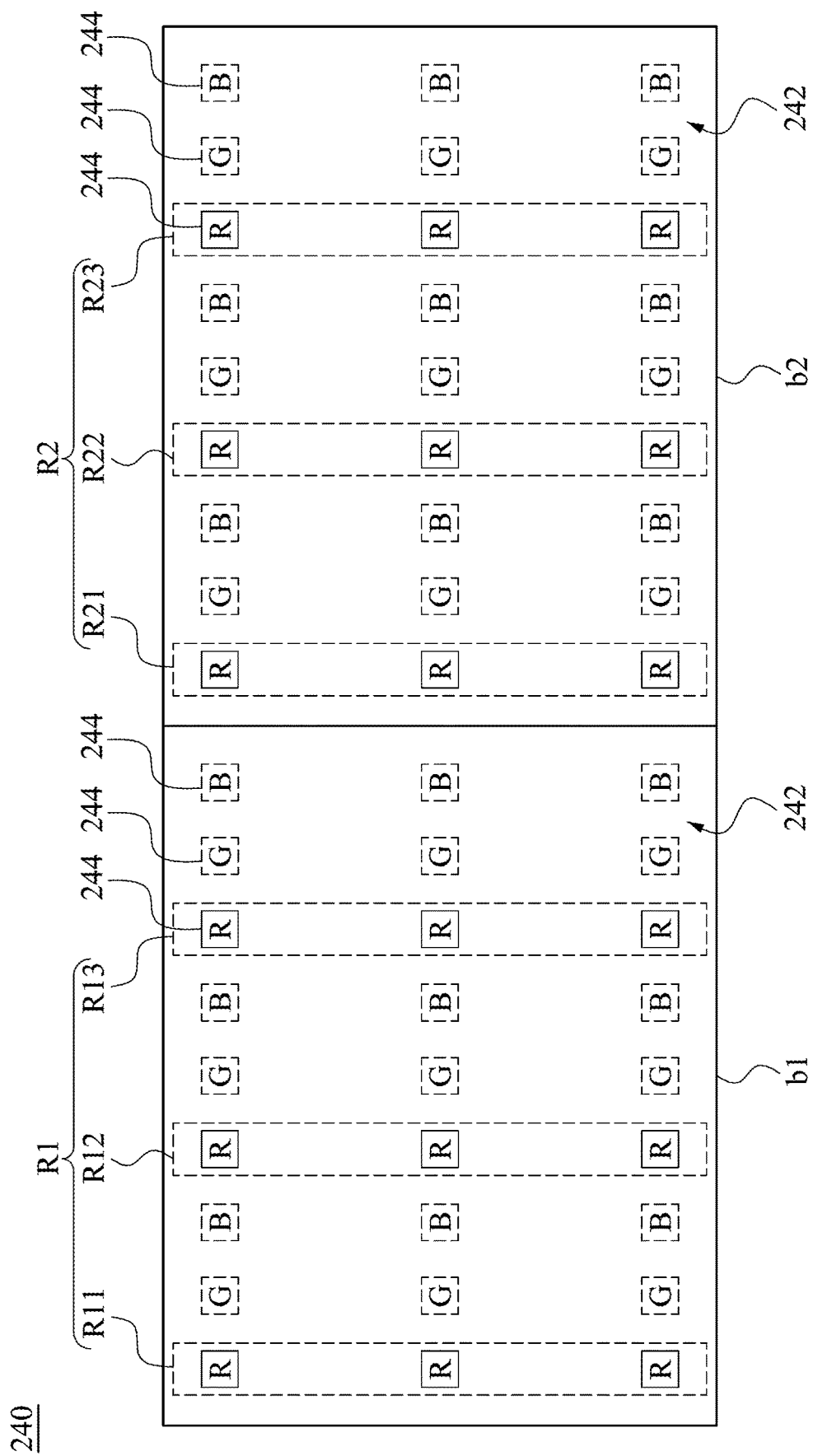
FIG. 3C is a schematic view of receiving locations on a top surface of a receiving substrate according to some embodiments of the present disclosure.

Reference is made to FIGS. 2A and 2B. FIG. 2A is a schematic top view of the carrier substrate 220 with micro devices 210 thereon. FIG. 2B is an enlarged top view E1 of a carrier substrate 220 with micro devices 210 thereon in FIG. 2A. The micro devices 210 may be transferred from another growth substrate, but should not be limited thereto. The carrier substrate 220 may be a rigid substrate. More specifically, the carrier substrate 220 may be made of glass, silicon, polycarbonate (PC), acrylonitrile butadiene styrene (ABS), or any combination thereof. Embodiments of this disclosure are not limited thereto. A pitch p1 as shown in the enlarged view E1 between two of adjacent micro devices 210 may be slightly larger than a lateral length L of the micro devices 210. The slightly larger pitch p1 may be due to a trench for dicing, and will not be described in detail herein.

Figure 2C:
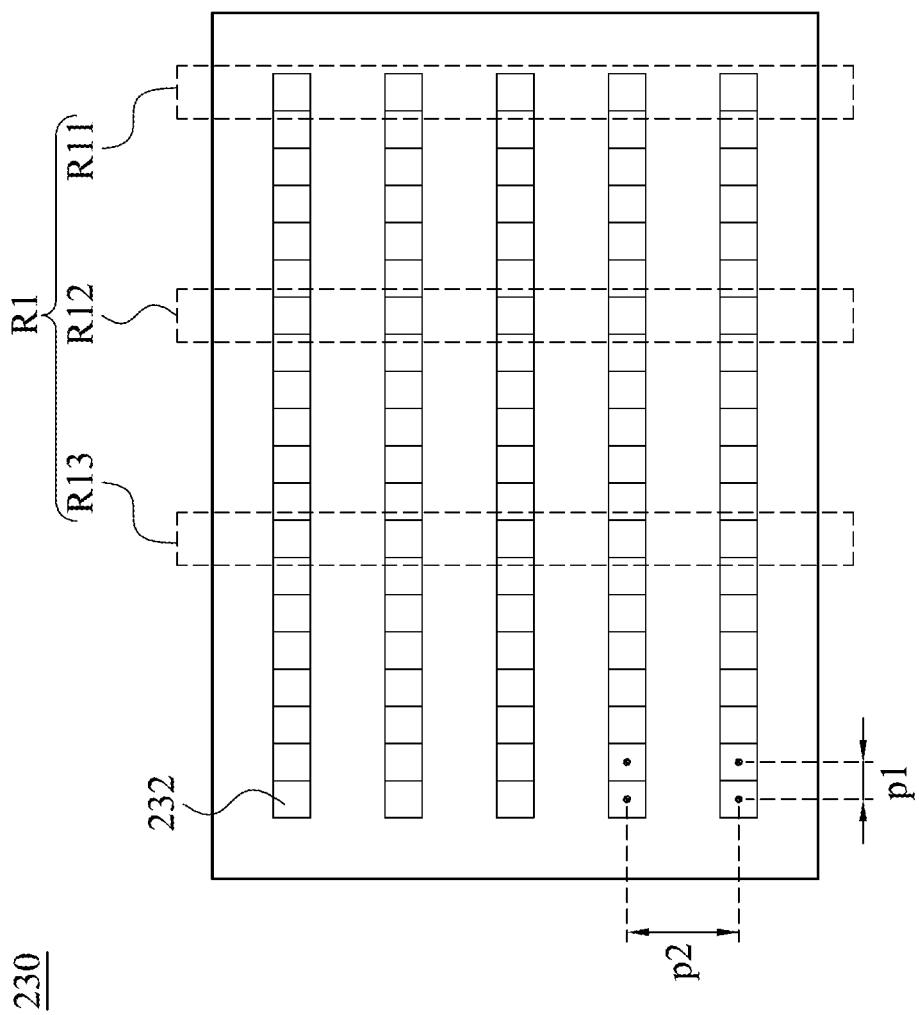
FIG. 2C is a schematic view of a portion of a transfer head with grip regions thereon according to some embodiments of the present disclosure.

Reference is made to FIG. 2C. FIG. 2C is a schematic view of a portion of the transfer head 230 with grip regions 232 thereon. The grip regions 232 are used for gripping micro devices 210 as illustrate by FIG. 2A. In some embodiments, the grip regions 232 are grouped into columns (e.g. R11, R12, R13), and an array (e.g. R1), in which the array R1 includes at least one column (e.g. R11, R12, R13, or combinations thereof) as exemplified in FIG. 2C. Just like those described in the embodiments illustrated by FIG. 2A, here the same notations R11, R12, R13, and R1 are used in both FIG. 2A, FIG. 2C and will also be used in the following FIG. 2D due to the convenience in comparison and correspondence. For example, there is a correspondence between micro devices 210 of the column R11 on the carrier substrate 220, grip regions 232 of the column R11 on the transfer head 230, and the receiving locations 244 of the column R11 on the receiving substrate 240.

In some embodiments, a pitch p1 along a direction perpendicular to a column of the grip regions 232 and a pitch p2 along a direction parallel to a column of the grip regions 232 may be different as shown in FIG. 2C. For example, the pitch p1 of the grip regions 232 may be the same as that of the pitch p1 of the micro devices 210 on the carrier substrate 220, and the pitch p2 of the grip regions 232 may be the same as that of the pitch p2 of the receiving locations 244 along one of the columns (e.g. R11, R12, or R13) on the receiving substrate 240 as will be shown in FIG. 2D. Furthermore, there is a pitch p3 defined as an interval between two adjacent columns (e.g. between R11 and R12) of the same array (e.g. R1). In some embodiments, pitch p2 is N times the pitch p1, and pitch p3 is M times the pitch p1, in which both n and m are integer, and M may be not equal or equal to N. The definition of "pitch" in the present disclosure is an interval between geometrical centers of two micro devices/grip regions/receiving locations, wherein said receiving locations will be illustrated in FIG. 2D.

A grip force of the transfer head 230 may be an electrostatics force, but should not limited thereto. Details of the transfer head 230 will be illustrated since FIG. 6A.

Figure 2D:
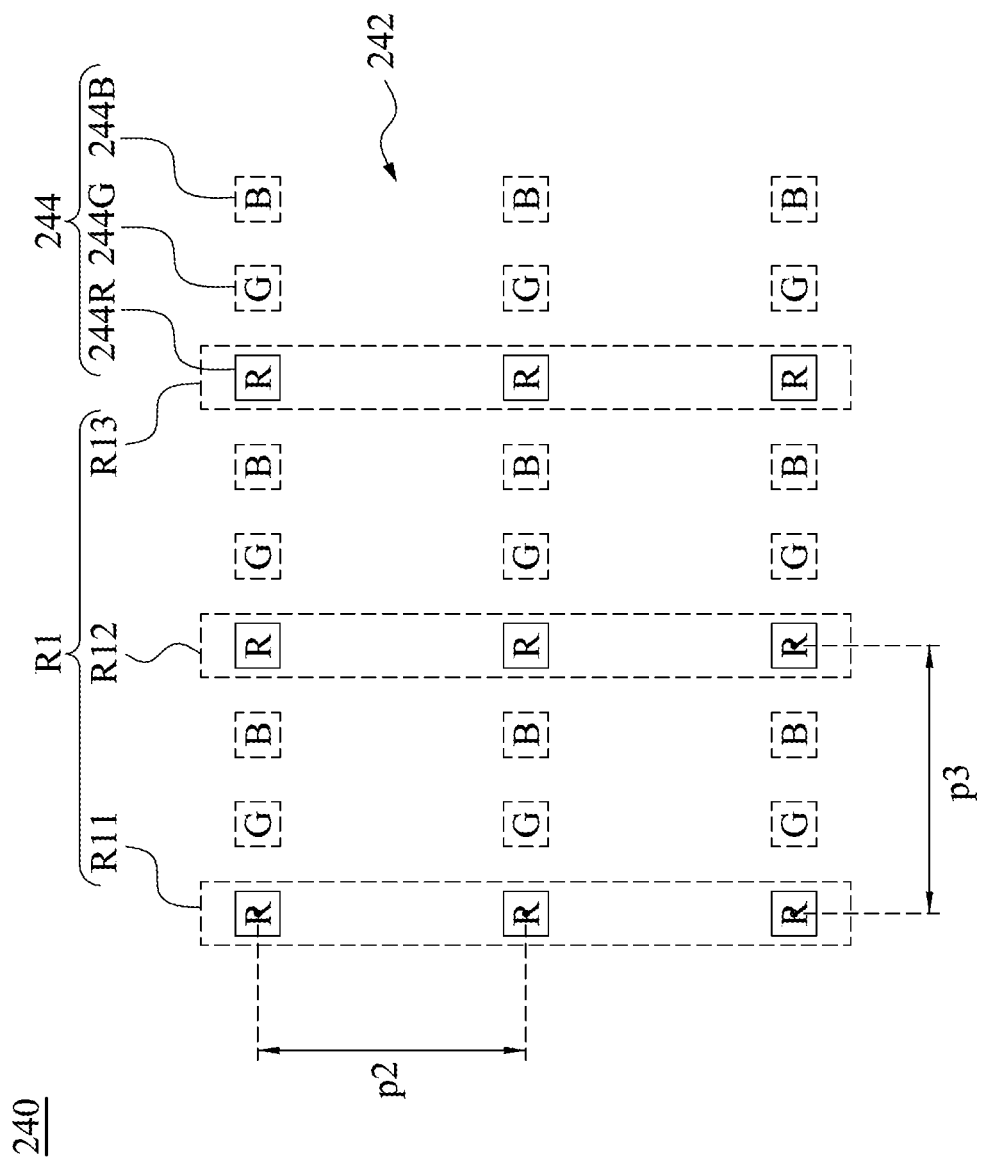
FIG. 2D is a schematic view of receiving locations on a top surface of a receiving substrate according to some embodiments of the present disclosure.

Reference is made to FIG. 2D. FIG. 2D is a schematic view of receiving locations 244 on a top surface 242 of a receiving substrate 240. After the picking up, the transfer head 230 is moved from the carrier substrate 220 to a position above a top surface 242 of the receiving substrate 240, in which the top surface 242 of the receiving substrate 240 is where the receiving locations 244 are. Then a placing process is performed. The receiving substrate 240 may be a display substrate, a lighting substrate, a substrate with functional devices such as transistors or integrated circuits, or a substrate with metal redistribution lines, but should not be limited thereto. It should be noted that, receiving locations 244R, receiving locations 244G, and receiving locations 244B are just notations to indicate that R, G, and B may come from different carrier substrates. In some embodiments, receiving locations 244R, 244G, and 244B may be locations for red LEDs, green LEDs, and Blue LEDs respectively, but should not be limited thereto. One of the receiving locations 244R, 244G, and 244B may also be a location for a LED with another color (e.g., yellow, cyan), or another type of device. In addition, the dotted lines of some receiving locations 244 (e.g. the receiving locations 244G and 244B in FIG. 2D) refer to receiving locations 244 that is still absent of micro devices 210 thereon in the current process.

As mentioned above, the micro devices 210 on the array R1 of the grip regions 232 are placed onto the array R1 of the receiving locations 244 of the receiving substrate 240. In some embodiments, grip regions 232 belonged to columns R11, R12, and R13 correspond to receiving locations 244 belonged to columns R11, R12, and R13 respectively. In the embodiments as shown in FIGS. 2A to 2D, since the transfer head 230 is controlled in a column basis, micro devices 210 picked up by the transfer head 230 but not belonged to the array R1 may remain attached on the transfer head 230 when the placing is performed.

In other words, a multi-phase control of the transfer head 230 in a column basis or array basis may be performed. For example, the array R1 is controlled in one phase in which an electrical voltage is adjusted so that the micro devices 210 on the grip regions 232 of the array R1 are released. On the other hand, grip regions 232 not belonged to the array R1 are controlled in another phase so that the micro devices 210 are kept on said grip regions 232 when the placing is performed. As such, iterative placing processes after only one picking up may be performed, as will be shown below.

Figure 2E:
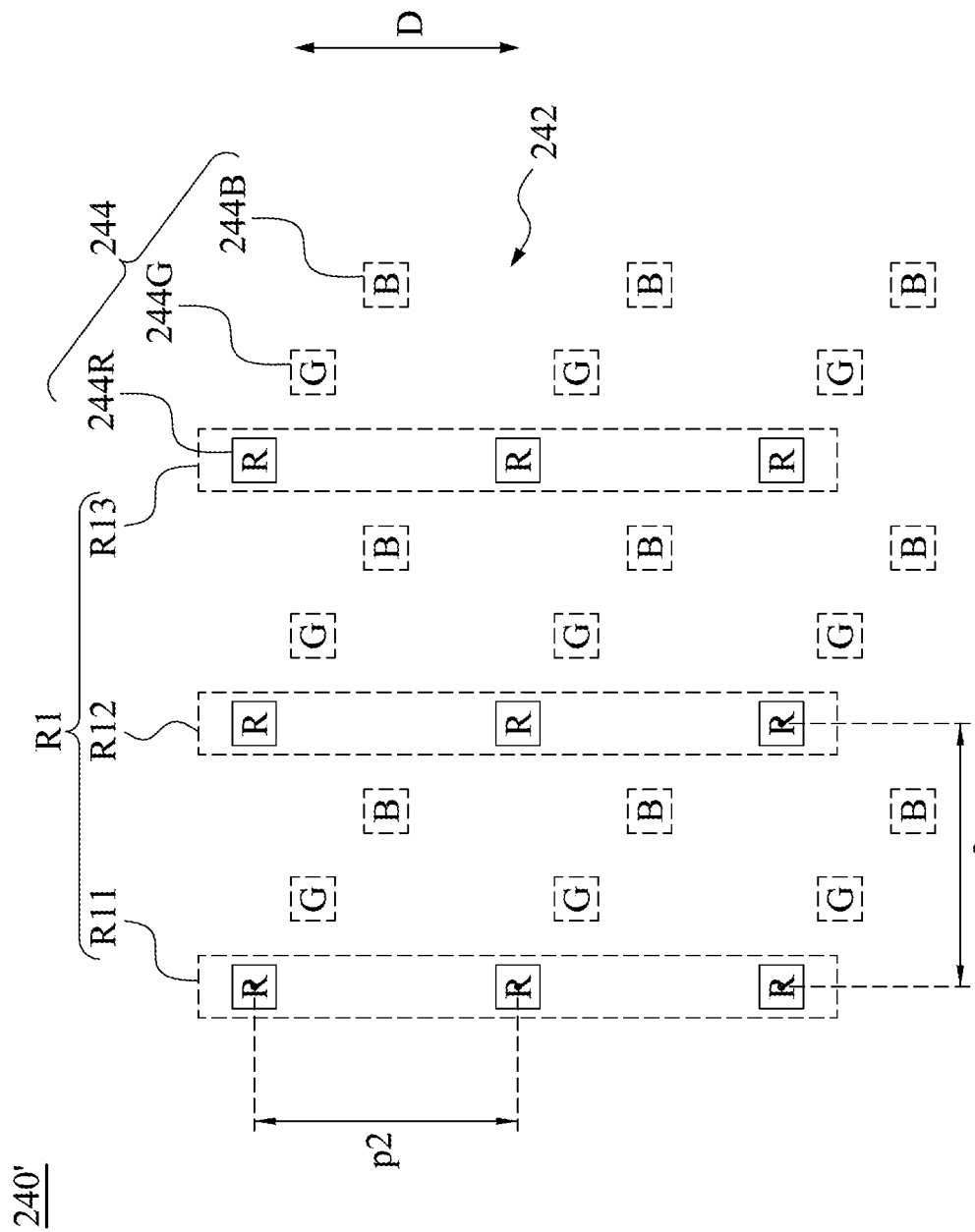
FIG. 2E is a schematic view of receiving locations on a top surface of a receiving substrate according to some embodiments of the present disclosure.

Reference is made to FIG. 2E. FIG. 2E is a schematic view of receiving locations 244 on a top surface 242 of a receiving substrate 240'. Comparing to the receiving substrate 240 illustrated in FIG. 2D, the receiving substrate 240' has some receiving locations 244 (e.g. receiving locations 244G and 244B) shifted along an extending direction D of columns R11, R12, R13. The receiving locations 244G and 244B are shifted along the same direction, and the receiving locations 244B shift more than the receiving locations 244G.

As mentioned above, some of the micro devices 210 are picked up from the carrier substrate 220 by the transfer head 230. Specifically, micro devices 210 of the array R1 on the carrier substrate 220 are picked up by the grip regions 232 of the array R1 on the transfer head 230. In general, not only micro devices 210 of the array R1 are picked up, another array having at least one column may also be picked up. The number of arrays or columns being picked up depends on a design of grip regions 232 on the transfer head 230 and also depends on columns chosen to be picked up by users. For example, in FIGS. 2D and 2E, the array R1 is picked up, and the array R1 includes three columns R11, R12, and R13.

Reference is made to FIGS. 3A to 3D. A second iteration i2 is performed. FIG. 3A is a schematic top view of the carrier substrate 220 with micro devices 210 thereon. FIG. 3B is a schematic view of a portion of the transfer head 230 with grip regions 232 thereon. FIG. 3C is a schematic view of receiving locations 244 on a top surface 242 of the receiving substrate 240. In some embodiments, two arrays of the micro devices 210 to be respectively placed by sequent two iterations of the placing process are at least partially embedded to each other on the carrier substrate 220 before the picking up, so that two of the columns adjacent to each other respectively belonged to said two arrays, and two of the micro devices 210 belonged to said two columns respectively are adjacent to one another on the carrier substrate 220 before the picking up. For example, in FIGS. 3A to 3C, the micro devices 210, the carrier substrate 220, the transfer head 230, and the receiving substrate 240 are the same as those illustrated in FIGS. 2A to 2D. The difference is that another array R2 including columns R21, R22, and R23 is marked to assist an illustration of the second iteration i2. In some embodiments, the array R2 is at least partially embedded into the array R1, such that one of the columns R21, R22, R23 is adjacent to one of the columns R11, R12, R13. For example, as illustrate in FIGS. 3A and 3B, the micro devices 210 in the column R21 are adjacent to the micro devices 210 in the column R11, and so do the relation between the columns R12 and R22 and the relation between the columns R13 and R23. As mentioned above, there is also a correspondence between micro devices 210 of the column R21 on the carrier substrate 220, grip regions 232 of the column R21 on the transfer head 230, and the receiving locations 244 of the column R21 on the receiving substrate 240. The columns R22 and R23 also follow said correspondence rule.

Figure 3D:
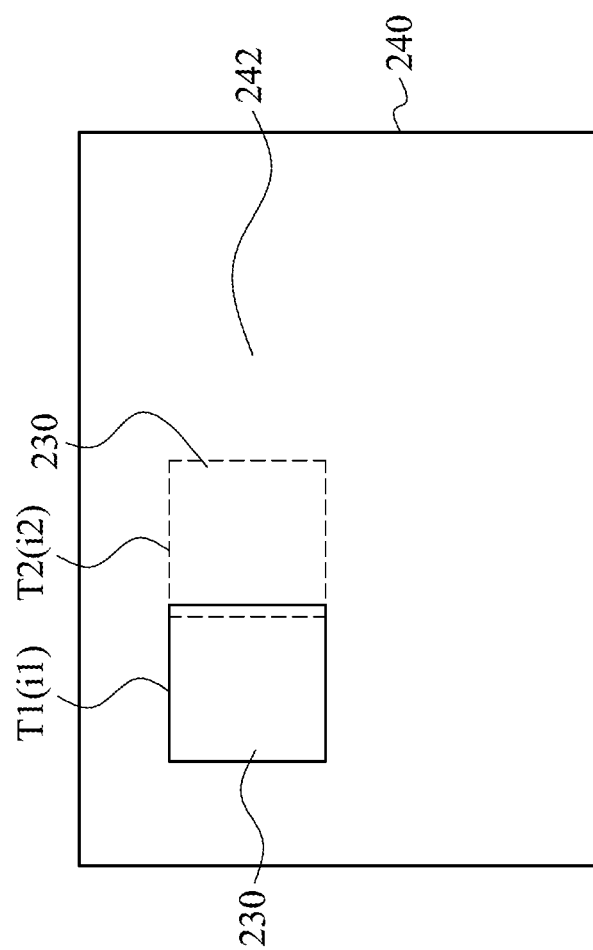
FIG. 3D is a schematic view of positions of a transfer head between subsequent iterations according to some embodiments of the present disclosure.

It should be noted that, in FIG. 3C, an array R2 of the receiving locations 244 is not embedded in the array R1 of the receiving locations, which is different from that shown in FIGS. 3A and 3B. As a result, micro devices 210 belonged to different arrays may be placed onto different blocks b1 and b2 on the receiving substrate 240 after a single picked-up operation, which results in efficiency enhancement on transferring the micro devices 210. As such, not only redundant movement of the transfer head 230 between the carrier substrate 220 and the receiving substrate 240 may be omitted, but also a movement of the transfer head 230 in each of the iterations may be reduced. This may be explained as follows with reference to FIGS. 3B to 3D. FIG. 3D is a schematic view of locations T1, T2 of the transfer head 230 between subsequent iterations. From the first iteration i1 to the second iteration i2, the transfer head 230 moves from a first location T1 at which grip regions 232 of the column R11 overlap with receiving locations 244 of the column R11 when viewed in a direction normal to a top surface 242 of the receiving substrate to a second place T2 at which grip regions 232 of the column R21 overlap with receiving locations 244 of the column R21 when viewed in the direction normal to the top surface 242 of the receiving substrate. As a result, a moving distance of about one pitch p1 (i.e. an interval between the column R11 and the column R21 of the grip regions 232 on the transfer head 230) is reduced for the transfer head 230 comparing to an interval between the column R11 and the column R21 of the receiving locations 244 on the receiving substrate 240. For example, in a case that one micro device 210 has a lateral length L of 10 μm and a dicing trench is 5 μm (i.e. the pitch p1 is 15 μm), the reduction of moving distance is about 15 μm, assuming that the lateral length L of one micro device 210 is about the same as the lateral length L of one grip region 232 for simplicity. Said reduction can have large effect on efficiency enhancement when it comes to massively transferring a large number of micro devices 210, e.g., about 0.1 to 1 million.

It should be noted that, although there are two iterations shown in FIG. 3C, the number of iterations is not limited thereto.

Reference is made to FIG. 3D. In some embodiments, during each iteration of the placing process, the transfer head 230 is at least partially superimposed over the receiving substrate 240 when viewed in a direction normal to the top surface 242 of the receiving substrate 240 as shown in FIG. 3D. The top surface 242 of the receiving substrate 240 is where the receiving locations 244 are. A slight overlap between positions of the transfer head 230 respectively at the first iteration i1 and second iteration i2 may be due to the reduction of moving distance as mentioned previously, but should not be limited thereto. In some other embodiments, the positions T1, T2 of the transfer head 230 respectively at the first iteration i1 and second iteration i2 may not overlap with each other.

Figure 4A:
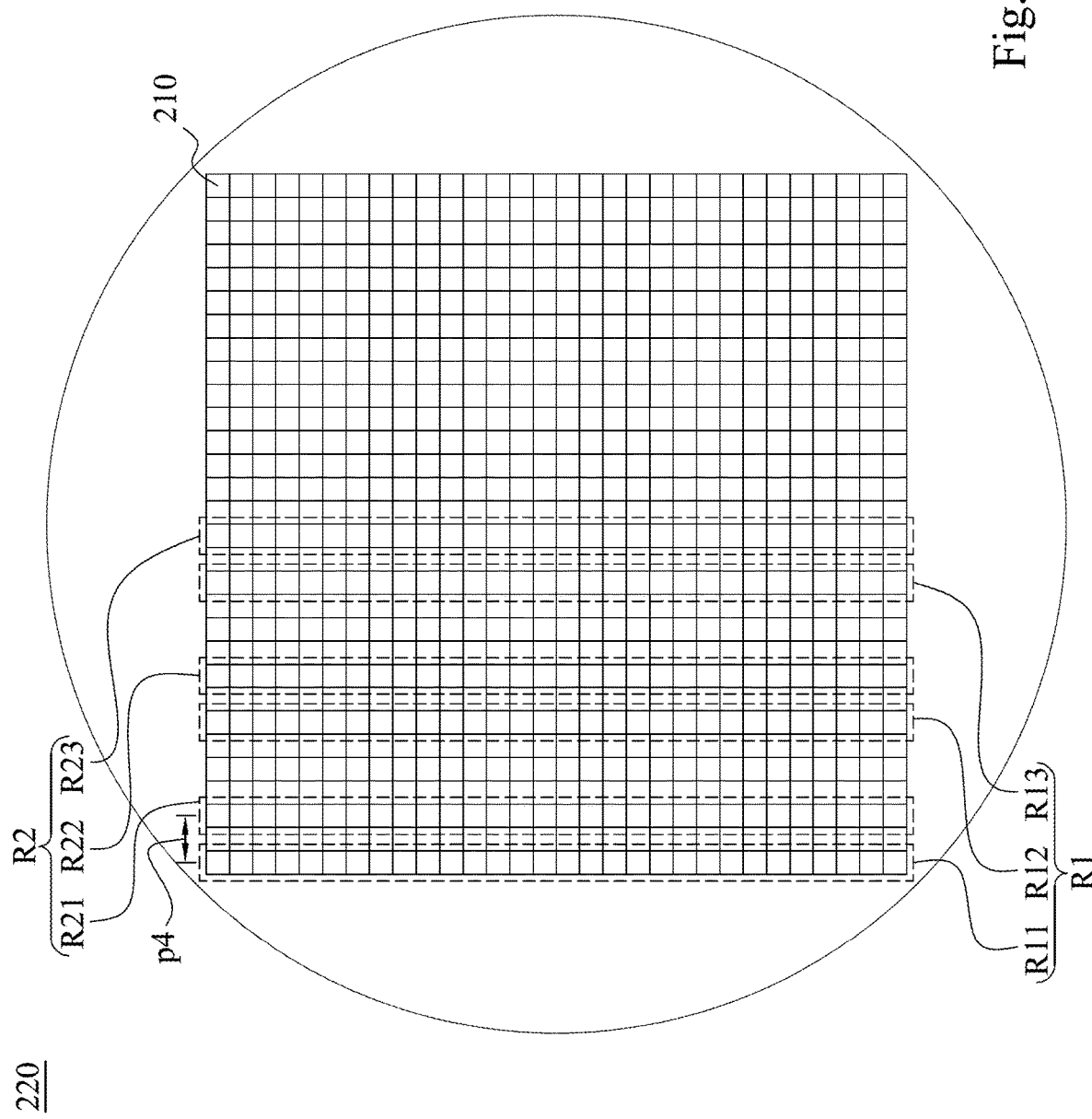
FIG. 4A is a schematic top view of a carrier substrate with micro devices thereon according to some embodiments of the present disclosure.
Figure 4B:
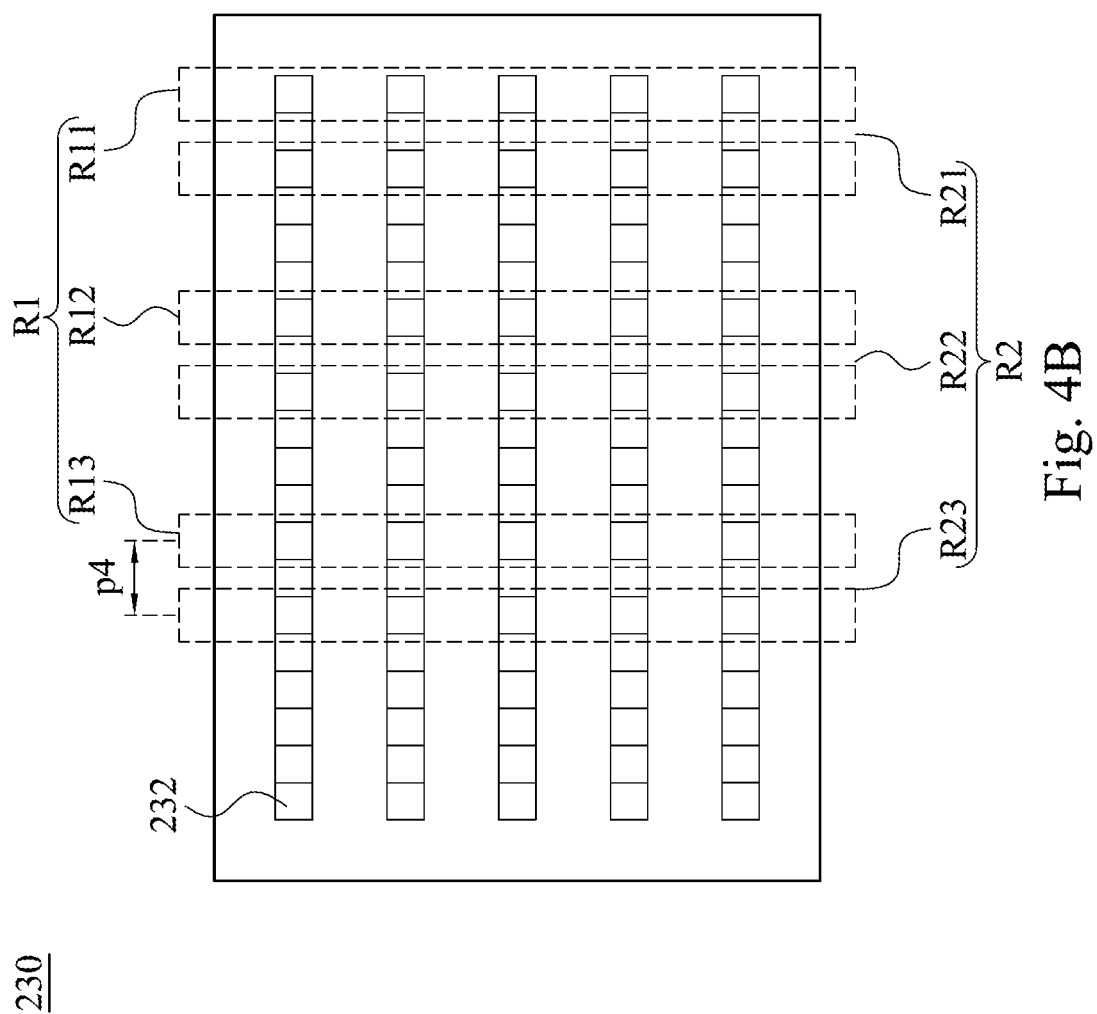
FIG. 4B is a schematic view of a transfer head with grip regions thereon according to some embodiments of the present disclosure.

Reference is made to FIGS. 4A and 4B. FIG. 4A is a schematic top view of the carrier substrate 220 with micro devices 210 thereon. FIG. 4B is a schematic view of the transfer head 230 with grip regions 232 thereon. In some embodiments, two arrays R1, R2 of the micro devices 210 to be respectively placed by sequent two iterations i1, i2 of the placing process are at least partially embedded to each other on the carrier substrate 220 before the picking up, so that two of the columns adjacent to each other are respectively belonged to the two arrays R1, R2, and two of the micro devices 210 belonged to said two columns (e.g. R21 and R11) respectively are interposed with one of the micro devices 210 not belonged to said two arrays R1, R2 on the carrier substrate 220 before the picking up. For example, a different pitch p4 between the column R11 and the column R21 on the carrier substrate 220 may be present. Schematic diagrams are shown in FIGS. 4A and 4B. As shown, intervals between columns R21 and R11, between columns R22 and R12, and between columns R23 and R13 increase by about one pitch p1 as compared to the embodiments illustrated by FIGS. 3A to 3B. As a result, further reduction of moving distance of the transfer head 230 between two subsequent iterations i1, i2 can be performed. For example, in a case where one micro device 210 has a lateral length L of 10 μm and a dicing trench is 5 μm (i.e. the pitch p1 is 15 μm), the reduction of moving distance is about 30 μm, assuming that the lateral length L of one micro device 210 is about the same as the lateral length L of one grip region 232 for simplicity.

Figure 5B:
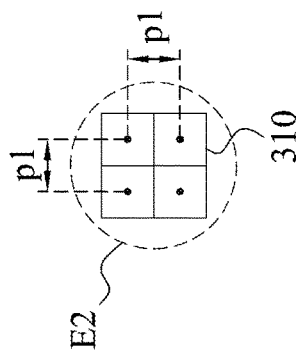
FIG. 5B is an enlarged top view of a carrier substrate with micro devices thereon according to some embodiments of the present disclosure.
Figure 5A:
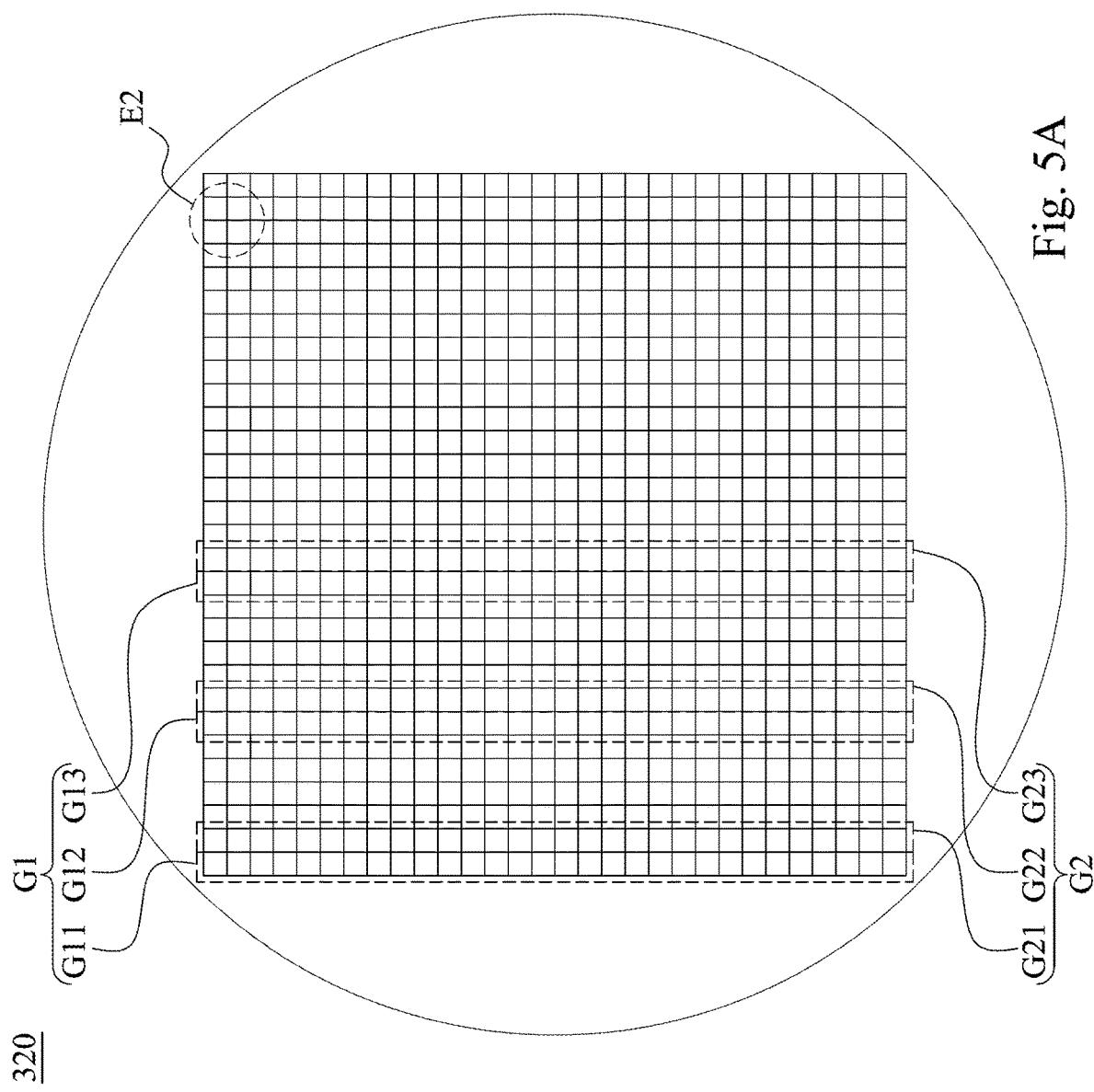
FIG. 5A is a schematic top view of a carrier substrate with micro devices thereon according to some embodiments of the present disclosure.
Figure 5C:
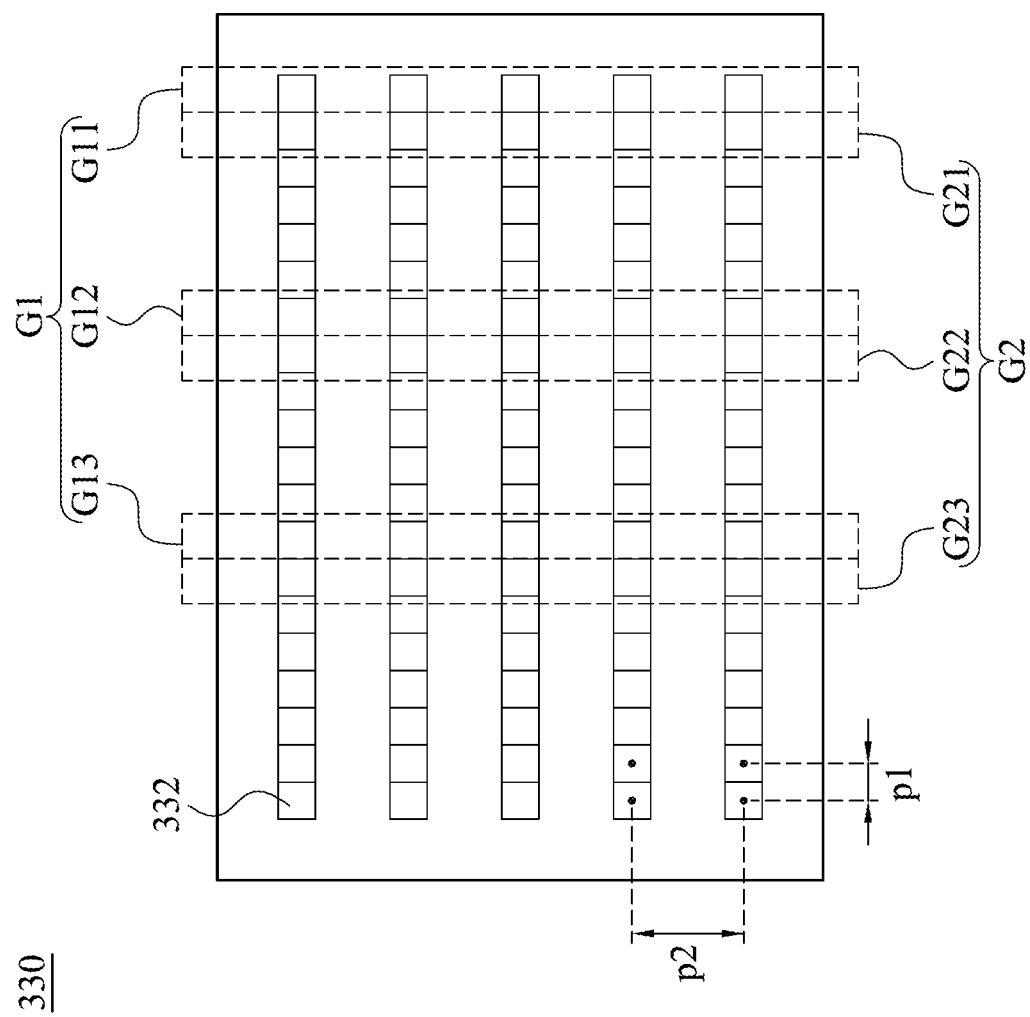
FIG. 5C is a schematic view of a portion of a transfer head with grip regions thereon according to some embodiments of the present disclosure.
Figure 5D:
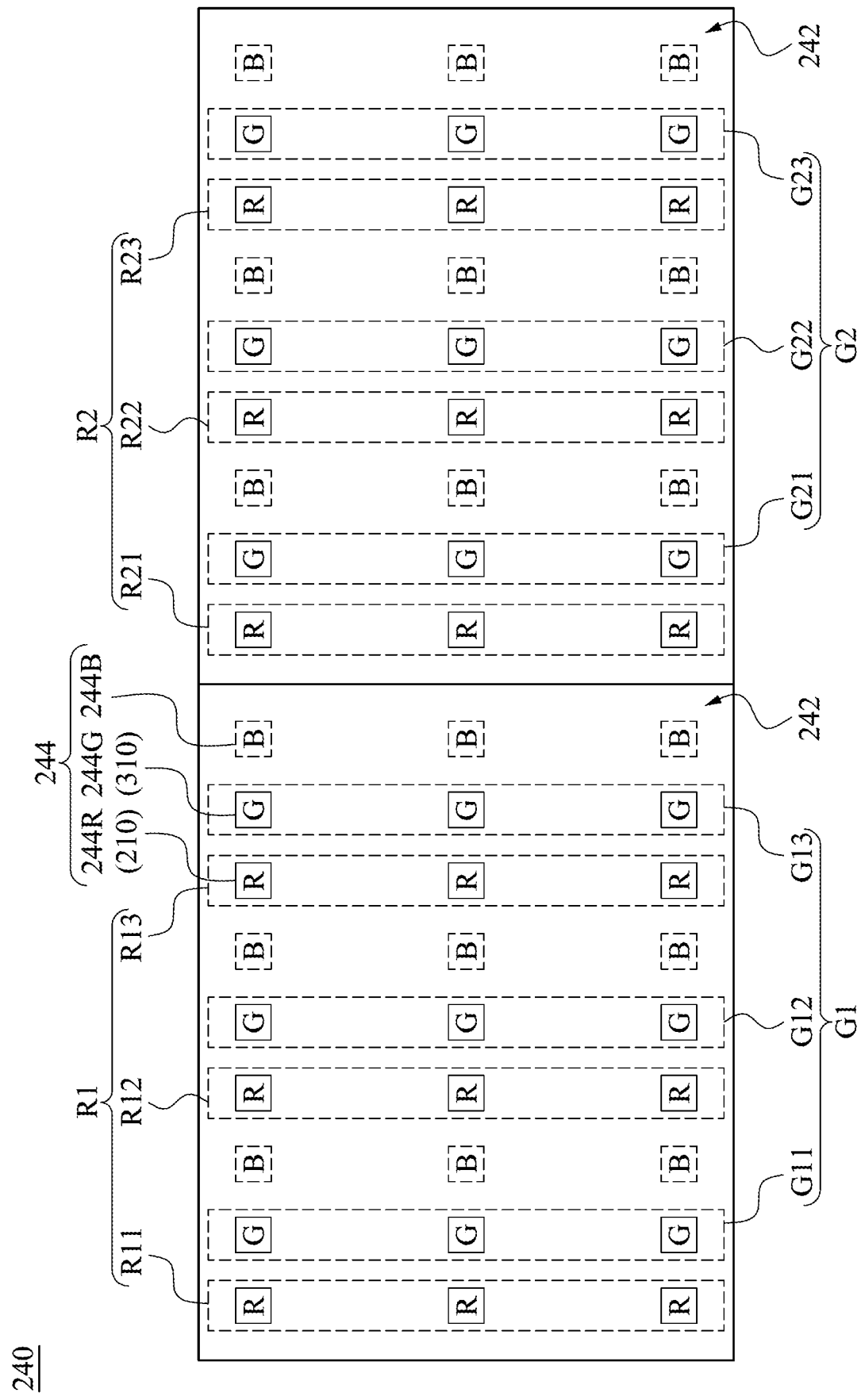
FIG. 5D is a schematic view of receiving locations on a top surface of a receiving substrate according to some embodiments of the present disclosure.

Reference is made to FIGS. 5A to 5D. FIG. 5A is a schematic top view of a carrier substrate 320 with micro devices 310 thereon. FIG. 5B is an enlarged top view E2 of a carrier substrate 320 with micro devices 310 thereon as shown in FIG. 5A. FIG. 5C is a schematic view of a portion of the transfer head 330 with grip regions 332 thereon. FIG. 5D is a schematic view of receiving locations 244 (including receiving locations 244R, 244G, and 244B) on a top surface 242 of the receiving substrate 240. In some embodiments, after a plurality of iterations are completed, another picking up and placing processes are performed by picking up another type of micro devices 310 from another carrier substrate 320 by the transfer head 330 and placing some of the micro devices 310 onto the same receiving substrate 240 as mentioned above in FIGS. 2D and 3C. As an example, the micro devices 210 may be red light micro light emitting diodes (R-pLED), and the micro devices 310 may be green light micro light emitting diodes (G-pLED), but should not be limited thereto. Other types of LEDs or other types of micro devices may not depart from the scope of current disclosure.

Specifically, similar to the embodiments mentioned above, the micro devices 310 on the carrier substrate 320 are grouped into a plurality of arrays, such as arrays G1 and G2. Each of the arrays G1, G2 may include a plurality of columns. For example, FIG. 5A exemplifies that the array G1 includes columns G11, G12, G13, and the array G2 includes columns G21, G22, G23. More arrays (e.g. arrays G3, G4 . . . ) and more columns in the same arrays (e.g. columns G14, G15 . . . in the array G1) are still within the scope of the present disclosure. As a correspondence, the transfer head 330 also has a plurality of grip regions 332 grouped into arrays G1, G2, wherein the array G1 includes columns G11, G12, G13, and the array G2 includes columns G21, G22, G23, as shown in FIG. 5C.

A picking up process and placing processes are similar to those of the embodiments illustrated by FIGS. 2A to 4B, and details will not be repeated herein. One result of the processes is shown in FIG. 5D. On the receiving substrate 240 there are micro devices 310 placed onto arrays G1, G2 of receiving locations 244, in which the array G1 is at least partially embedded into the array R1, and the array G2 is at least partially embedded into the array R2. In some embodiments as shown in FIG. 5D, the column G11 is adjacent to the column R11, the column G12 is adjacent to the column R12, and the column G13 is adjacent to the column R13. A spatial relation between the array R2 and the array G2 is similar to that between the arrays R1, G1 and will not be repeated in detail herein.

As such, multiple types of micro devices derived from different carrier substrates can be placed on to the same receiving substrate using the method 100 mentioned above. This is useful in, for example, display industry.

Figure 6A:
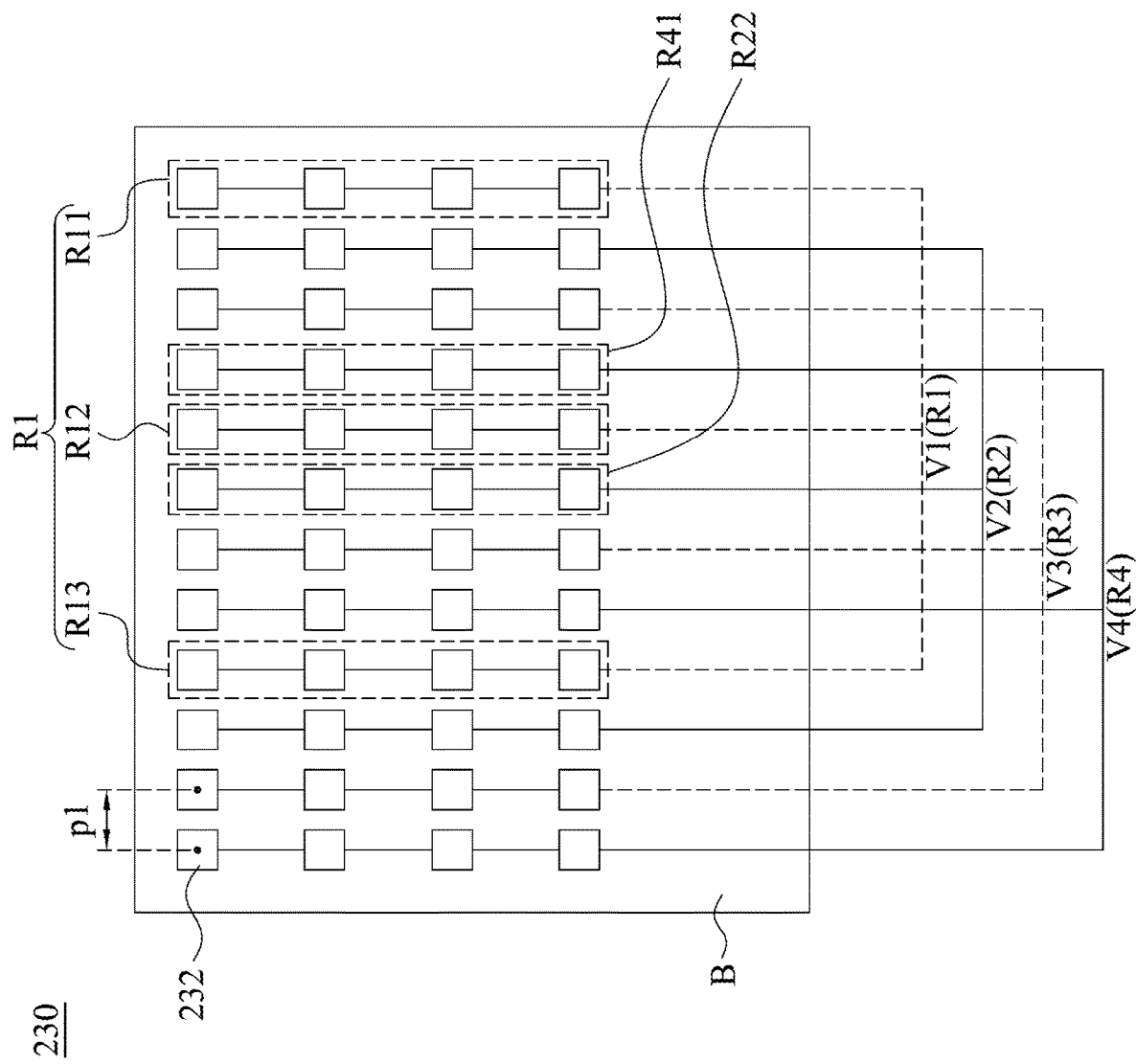
FIG. 6A is a schematic diagram of electrical connections of grip regions on a portion of a transfer head according to some embodiments of the present disclosure.

In another aspect, a transfer head 230 is provided. The transfer head 230 may be used in the method 100 mentioned above, but should not be limited thereto. Reference is made to FIG. 6A with assistance from FIGS. 2C and 3B, in which a portion of the transfer head 230 is illustrated. FIG. 6A is a schematic diagram of electrical connections of grip regions 232 on a portion of the transfer head 230. In some embodiments, the transfer head 230 includes a body B. The body B has a plurality of arrays (e.g. the array R1 as shown in FIG. 6A) of grip regions 232. Each of the arrays RX (X is an integer) includes at least two columns (e.g. the columns R11, R12, R13 for the array R1) of the grip regions 232. The grip regions 232 in one of the columns (e.g. the column R11) are electrically connected in series. The columns in one of the arrays are controlled by a single voltage source, and the columns in two of the arrays are controlled by two voltage sources respectively. For example. The columns R11, R12, R13 in the array R1 are controlled by a single voltage source V1, and the columns R21, R22, R23 in the array R2 (not explicitly labeled in the figure for simplicity) are controlled by another voltage source V2. Voltage source V1 and V2 are electrically isolated from one another. In FIG. 6A only the array R1 and corresponding columns R11, R12, R13 connected to the voltage source V1 are shown, one may expect that the voltage sources V2, V3, V4 are respectively connected to the arrays R2, R3, R4 (not explicitly labeled in the figure for simplicity).

In some embodiments, the arrays such as R1 and R2 are at least partially embedded in one another in which two of the columns adjacent to each other are respectively belonged to two of the arrays. It can be explained by FIG. 6A as an example. The column R12 belonged to the array R1 is adjacent to the columns R41 and R22 respectively belonged to the array R4 and the array R2.

Figure 6B:
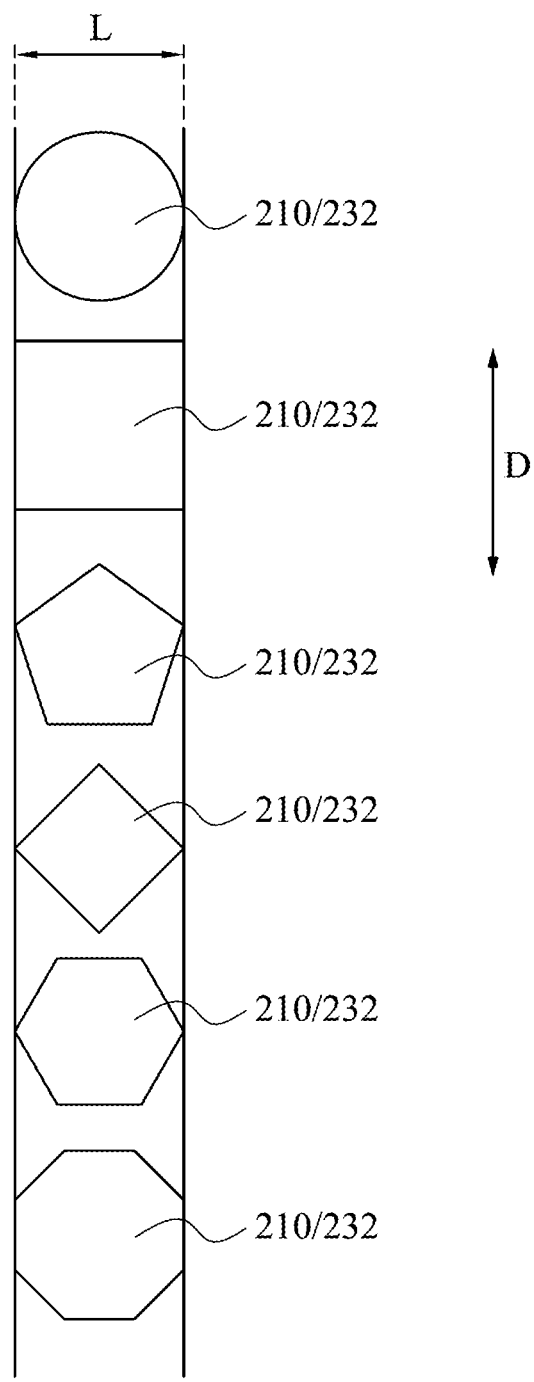
FIG. 6B is a schematic diagram of a definition of a lateral length according to some embodiments of the present disclosure.

In some embodiments, a pitch p1 between the adjacent columns is less than twice of a lateral length L of one of the grip regions. For example, since the transfer head 230 illustrated in FIGS. 2C and 3B is able to pick up adjacent micro devices 210 on the carrier substrate 220, the pitch p1 of adjacent columns is substantially equal to the pitch p1 of the micro devices 210 on the carrier substrate 220, which is less than twice of the lateral length L of one grip region. One grip region 232 is designed to have a lateral length L about the same as that of one micro device 210 in these embodiments, but in other embodiments it should not be limited thereto. It should be noted that, the meaning of "adjacent" defined hereinafter has some exclusive cases. One exclusive case is explained as follows. Assuming a total number of arrays is Q, and the $S_{th}$ column in the $Q_{th}$ array is denoted by (Q,S), one can find that although the column(Q,S) is adjacent to the column(1,S+1), a pitch q between the column (Q,S) and the column(1,S+1) may be different from the pitch p1 as mentioned above. As a result, the pitch q is excluded from the definition of "adjacent". Furthermore, a definition of the "lateral length L" is described in FIG. 6B. FIG. 6B is a schematic diagram of a definition of a lateral length L. Six different shapes of micro devices 210/grip regions 232 are shown as an example. The lateral length L is defined in a direction perpendicular to an extending direction D of a column as shown in the figure.

Reference is made to FIGS. 4B and 6C. FIG. 6C is a schematic view of a portion of the transfer head 230' with grip regions 232 thereon. In other embodiments, a pitch between the adjacent columns is more than or equal to twice of a lateral length L of one of the grip regions 232. For example, since the transfer head 230 in FIG. 4B and the transfer head 230' in FIG. 6C are able to pick up non-adjacent micro devices 210 on the carrier substrate 220, a pitch p4 of adjacent columns (e.g. columns R23 and R13) is substantially more than or equal to twice of the pitch p1 of the micro devices 210 on the carrier substrate 220, which is more than or equal to twice of the lateral length L of one grip region 232. The difference between transfer head 230 in FIG. 4B and the transfer head 230' in FIG. 6C is that, in the transfer head 230' two adjacent columns of the 2 arrays have no grip region 232 in between in FIG. 6C comparing to the transfer head 230.

Figure 7B:
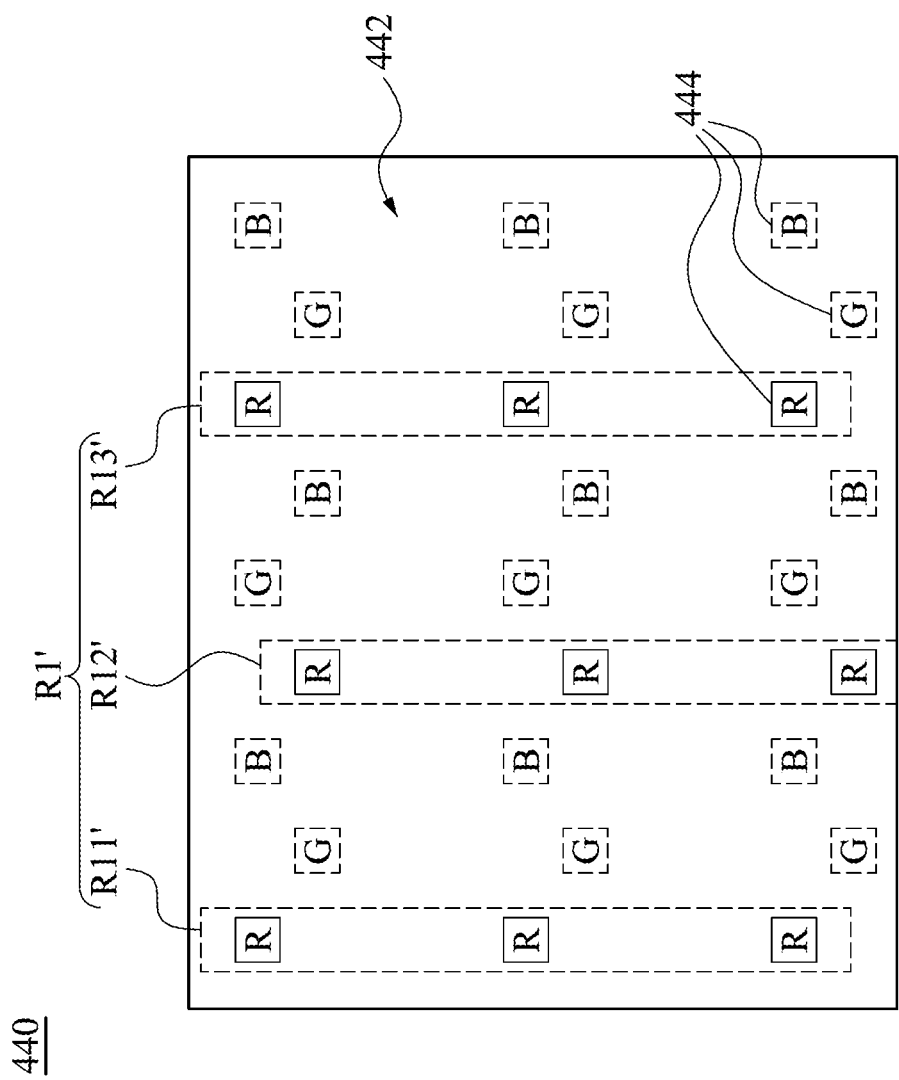
FIG. 7B is a schematic view of receiving locations on a top surface of receiving substrate according to some embodiments of the present disclosure.

Reference is made to FIGS. 7A and 7B. FIG. 7A is a schematic view of a portion of a transfer head 430 with grip regions 432 thereon. FIG. 7B is a schematic view of receiving locations 444 on a top surface 442 of the receiving substrate 440. In some embodiments, the columns have an extending direction D. The grip regions 432 of a part of the columns are dislocated from the grip regions 432 of a remaining part of the columns along the extending direction D. Specifically, in one of the arrays such as an array R1', the grip regions 432 of at least one of the columns among columns R11', R12', and R13' are dislocated from the grip regions 432 of a remaining part of the columns along the extending direction D. Furthermore, in one of the arrays such as R1' shown in FIG. 7A, the grip regions 432 of at least one of the columns R11', R12', and R13' are dislocated from the grip regions 432 of a remaining part of the columns along the extending direction D. In some embodiments, the columns in each of the arrays respectively (e.g. R1' and R2' in FIG. 7A) are dislocated in a staggered manner. As such, a delta type arrangement such as an array R1' shown in FIG. 7B may be performed by the transfer head 430 mentioned above.

In some embodiments, the micro devices 210 of the array R1 (or the array R1') to be placed by the first iteration i1 of the placing process and the micro devices 210 of the array R2, (or the array R2') to be placed by the second iteration i2 of the placing process are arranged in the same arrangement on the carrier substrate 220, 320. This can be achieved by using different types of transfer head such as transfer head 230 in FIG. 6A and transfer head 430 in FIG. 7A. When the arrangement is stripe type, the transfer head 230 is used. When the arrangement is delta type, the transfer head 430 is used.

Figure 8A:
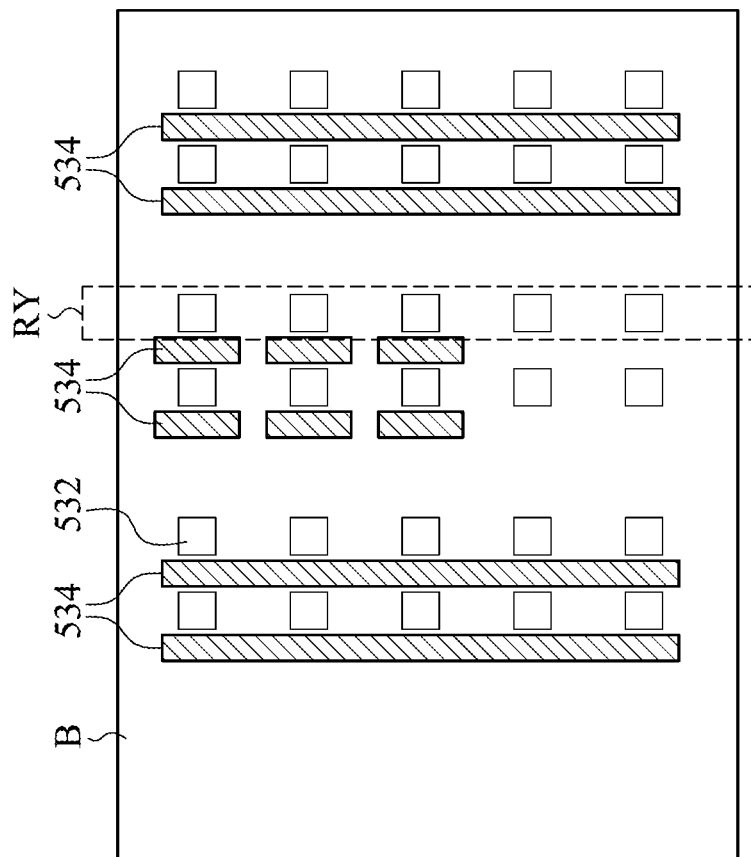
FIGS. 8A to 8C are schematic views of grip regions and recesses of a portion of some types of transfer head in some embodiments of the present disclosure according to some embodiments of the present disclosure.
Figure 8B:
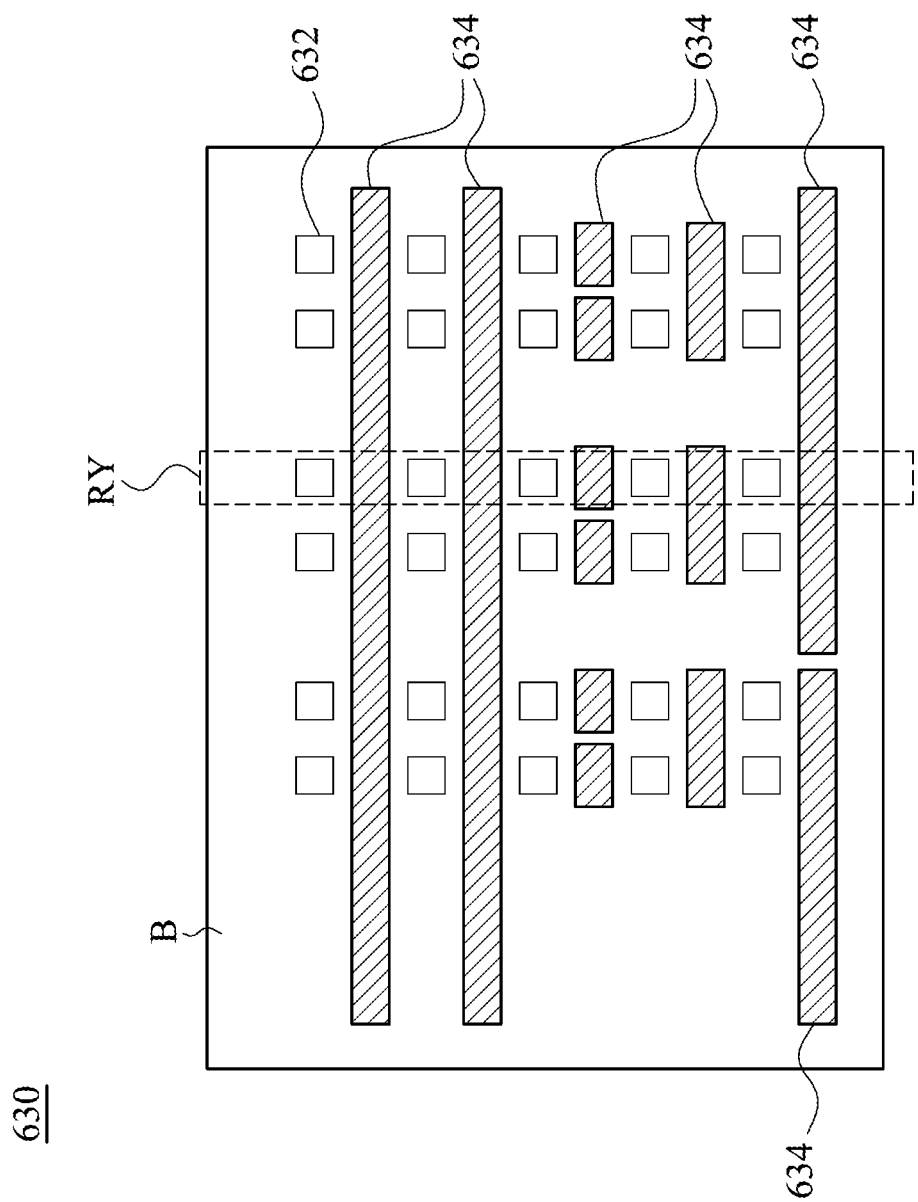
Figure 8C:
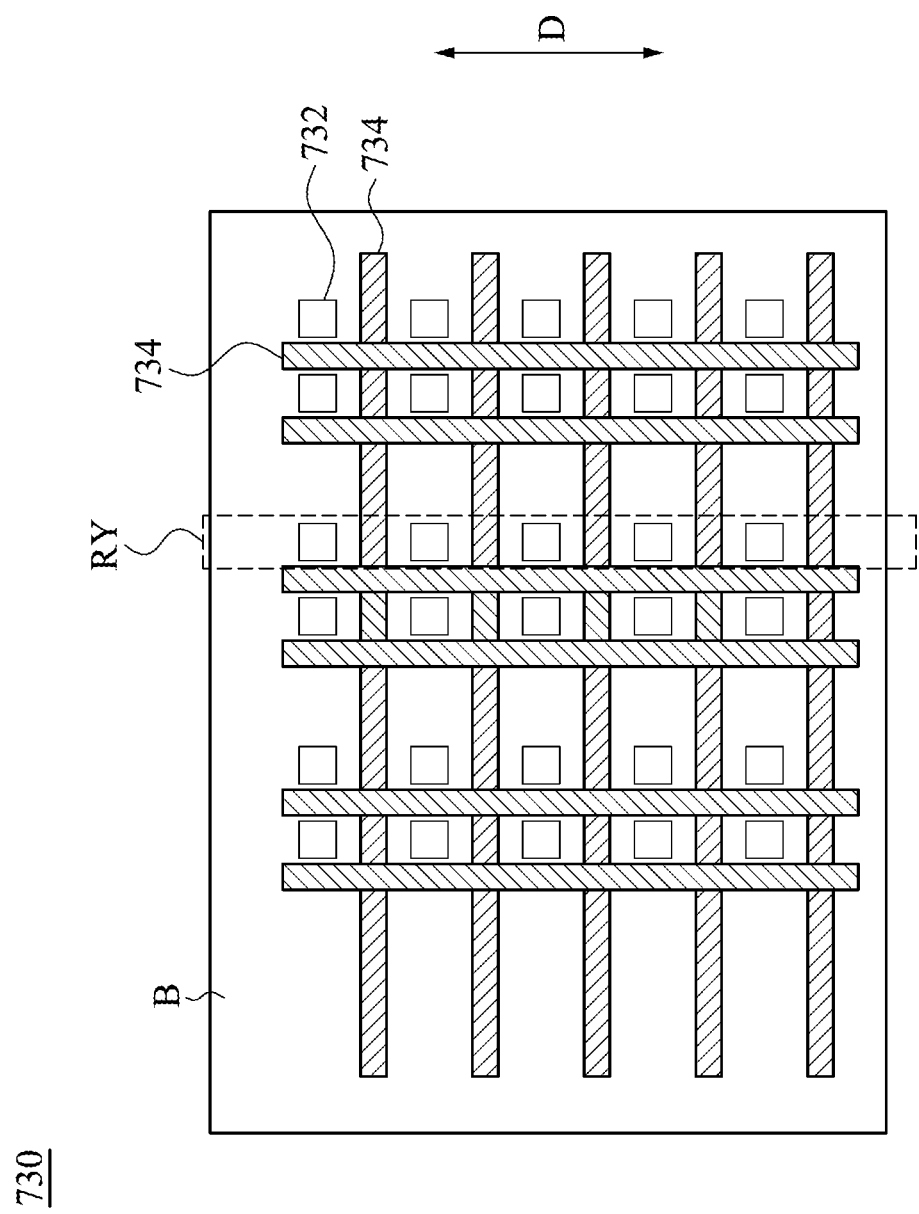

Reference is made to FIGS. 8A to 8C. In some embodiments, the transfer head may have at least one recess therein. FIGS. 8A to 8C are schematic views of grip regions 532, 632, 732 and recesses 534, 634, 734 of a portion of some types of transfer head 530, 630, 730 in some embodiments of the present disclosure. As shown, the body B further includes a plurality of recesses 534, 634, 734. In some embodiments, one of the recesses 534 is present between the grip regions 532 in adjacent two of the columns RY, or one of the columns RY is present between adjacent two of the recesses 534, as exemplified in FIG. 8A. In some embodiments, one of the recesses 634 is present between adjacent two of the grip regions 632 in one of the columns RY, or one of the grip regions 632 in one of the columns RY is present between adjacent two of the recesses 634 inserting said one of the columns RY, as exemplified in FIG. 8B. For embodiments illustrated by FIGS. 8A and 8B respectively, one of the recesses 534 is isolated from other recesses 534, and one of the recesses 634 is isolated from other recesses 634. In some other embodiments, recesses 534, 634 may be combined to form recesses 734 as shown in FIG. 8C, in which recesses 734 crossing one of the columns RY and recesses 734 extending along the extending direction D and between the columns RY co-exist.

Figure 8D:
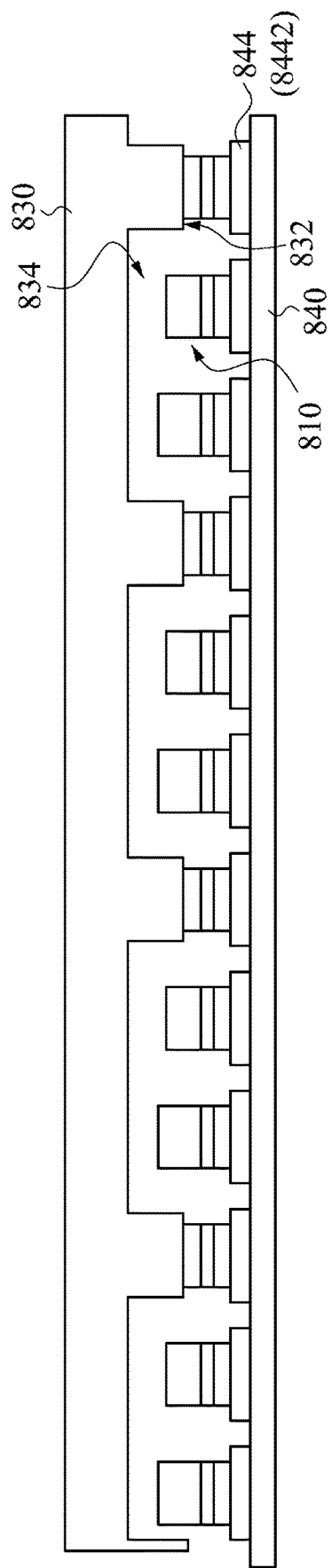
FIG. 8D is a schematic side view of a transfer head when one of placing processes is performed according to some embodiments of the present disclosure.

Reference is made to FIG. 8D. FIG. 8D is a schematic side view of a transfer head 830 when one of the placing processes is performed. In some embodiments, recesses 834 among the grip regions 832 may be used to accommodate some of micro devices 810 located on the receiving substrate 840 before the placing. The receiving locations 844 are illustrated in FIG. 8D. In some embodiments, each of the receiving locations 844 may include at least one conductive pad 8442 thereon for an electrical contact between at least one micro device 810 and the receiving substrate 840.

Reference is made to FIG. 9. FIG. 9 is a schematic enlarged view of a portion of a transfer head 930 in some embodiments of the present disclosure. One method of electrical connection is shown. As shown in the figure, there is a plurality of metal lines 936. Each of the metal lines 936 connects a plurality of grip regions 932 in series. A plurality of recesses 934 are present. Each of the recesses 934 is present between two of the grip regions 932 as shown in the figure. It should be noted that, the transfer head 930 as shown in FIG. 9 is only an example and should not be limited thereto.

In summary, some embodiments of the present disclosure demonstrate a method that can save time when a mass transfer of micro devices is performed by iterative placing after one picking up. Furthermore, some transfer heads are shown to perform the method. The design of array-based control of grip regions on those transfer heads also reduce the complexity of circuit design, thus costing down the manufacture of a transfer head.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for transferring a plurality of micro devices, comprising:
  picking up the micro devices from a carrier substrate by a transfer head; and
  iteratively performing a placing process, wherein the placing process comprises:
    moving the transfer head to a position, at which an array of the micro devices is positioned over an array of receiving locations of a receiving substrate, wherein the array comprises at least two columns; and
    placing said array of the micro devices onto the array of receiving locations of the receiving substrate;
  wherein two of the arrays of the micro devices to be respectively placed by sequent two iterations of the placing process are at least partially embedded to each other on the carrier substrate before the picking up, and said two of the arrays of the micro devices are completely separated from each other on the receiving substrate after said sequent two iterations of the placing process.

2. The method of claim 1, wherein during each iteration of the placing process, the transfer head is at least partially superimposed over the receiving substrate when viewed in a direction normal to a top surface of the receiving substrate, and the top surface of the receiving substrate is where the receiving locations are.

3. The method of claim 1, wherein the micro devices of a first array to be placed by a first iteration of the placing process and the micro devices of a second array to be placed by a second iteration of the placing process are arranged in an arrangement on the carrier substrate.

4. The method of claim 3, wherein the arrangement is delta type.

5. The method of claim 3, wherein the arrangement is stripe type.

6. The method of claim 1, wherein before the picking up, two of the columns adjacent to each other respectively belong to said two of the arrays and two of the micro devices belong to said two columns respectively are adjacent to one another on the carrier substrate.

7. The method of claim 1, wherein before the picking up, two of the columns adjacent to each other respectively belong to said two of the arrays and two of the micro devices belong to said two columns respectively are interposed with one of the micro devices not belonged to said two arrays on the carrier substrate.

8. The method of claim 1, wherein at least one micro device is located on the receiving substrate before the placing, the transfer head has at least one recess therein, and the placing further comprises:

accommodating the micro device in the recess.

9. The method of claim 1, wherein the transfer head is an electrostatic transfer head.

* * * * *